(12) United States Patent
Takahashi et al.

(10) Patent No.: US 7,692,978 B2
(45) Date of Patent: Apr. 6, 2010

(54) SEMICONDUCTOR DEVICE THAT USES A PLURALITY OF SOURCE VOLTAGES

(75) Inventors: Hiroyuki Takahashi, Kanagawa (JP); Atsushi Nakagawa, Kanagawa (JP)

(73) Assignee: NEC Electronics Corporation, Kawasaki, Kanagawa (JP)

( * ) Notice: Subject to any disclaimer, the term of this patent is extended or adjusted under 35 U.S.C. 154(b) by 117 days.

(21) Appl. No.: 12/153,814

(22) Filed: May 23, 2008

(65) Prior Publication Data

US 2008/0291750 A1 Nov. 27, 2008

(30) Foreign Application Priority Data

May 25, 2007 (JP) .............................. 2007-138627
Apr. 2, 2008 (JP) .............................. 2008-095835

(51) Int. Cl.
*G11C 7/00* (2006.01)

(52) U.S. Cl. .............................. 365/189.09; 365/189.05; 365/226

(58) Field of Classification Search ............ 365/189.09, 365/189.05, 226

See application file for complete search history.

(56) References Cited

U.S. PATENT DOCUMENTS

| 5,926,427 | A * | 7/1999 | Kim ............................ 365/206 |
| 6,172,928 | B1 | 1/2001 | Ooishi |
| 6,366,506 | B1 | 4/2002 | Mizuno et al. |
| 6,414,894 | B2 | 7/2002 | Ooishi et al. |
| 6,567,310 | B2 * | 5/2003 | Einaga et al. ............. 365/185.2 |
| 6,768,354 | B2 | 7/2004 | Yamazaki et al. |
| 7,586,775 | B2 * | 9/2009 | Kang et al. ................. 365/148 |

FOREIGN PATENT DOCUMENTS

| JP | 11-213667 | 6/1999 |
| JP | 2000-173263 | 6/2000 |
| JP | 2001-110184 | 4/2001 |
| JP | 2001-338489 | 12/2001 |
| JP | 2002-042459 | 2/2002 |

OTHER PUBLICATIONS

Japanese Office Action dated Apr. 14, 2009 with partial English-Language translation.

\* cited by examiner

*Primary Examiner*—Connie C Yoha
(74) *Attorney, Agent, or Firm*—McGinn IP Law Group PLLC

(57) ABSTRACT

A semiconductor device includes a first memory; and a voltage adjusting portion configured to receive a first voltage, a second voltage higher than the first voltage, and a third voltage higher than the second voltage. The first memory includes: a memory cell configured to be connected to a word line and a bit line, a word-line driving circuit configured to drive the word line, and a sense amplifier configured to sense information stored in the memory cell. The voltage adjusting portion includes: a voltage modifying circuit configured to step down or boost up the third voltage at a predetermined mode to generate a fourth voltage higher than the second voltage, and supply the fourth voltage to the sense amplifier or the word-line driving circuit.

15 Claims, 15 Drawing Sheets

Fig. 9

|  |  | INTERNAL VOLTAGE | | |
|---|---|---|---|---|
|  |  | VPP | VPD | VSA |
| EXTERNAL INPUT | VPP | EXTERNAL VPP | STEP-DOWN | STEP-DOWN |
|  | VPD | BOOST-UP | EXTERNAL VPD | STEP-DOWN |
|  | VSA | BOOST-UP | BOOST-UP | EXTERNAL VSA |

SEMICONDUCTOR DEVICE THAT USES A PLURALITY OF SOURCE VOLTAGES

BACKGROUND OF THE INVENTION

1. Field of the Invention

The present invention relates to a semiconductor device and, more specifically, to a semiconductor device that uses a plurality of source voltages.

This application is based upon and claims the benefit of priority from Japanese patent applications No. 2007-138627 filed on May 25, 2007 and No. 2008-95835 filed on Apr. 2, 2008, the disclosure of which are incorporated herein in their entirety by reference.

2. Description of Related Art

It is well known that there is a semiconductor device which operates by using a plurality of types of internal source voltages. The semiconductor device selectively uses the plurality of internal source voltages depending on types of internal circuits. FIG. 1 is a block diagram showing an example of a structure of such typical semiconductor device. This semiconductor device 101 receives a source voltage VDD (e.g. 1.5 V) and a ground voltage GND (e.g. 0 V) supplied from outside. The semiconductor device 101 includes a memory macro 102, a step-down circuit 111, a step-down circuit 112, a reference power supply 113, a negative pump (N-pump) 114, and a positive pump (P-pump) 115.

The memory macro 102 is a DRAM core, which includes a cell array core 103 for storing data and a peripheral circuit 104 for controlling the cell array core 103. The cell array core 103 includes a plurality of cells arranged in matrix, a plurality of sense amplifiers, a word-line driving circuit, a bit-line precharge circuit, and a sense amplifier driving circuit. The peripheral circuit 104 includes a decoder and a controller.

The step-down circuit 111 reduces the source voltage VDD to generate a High-side source voltage VPD (e.g. 1.2 V) of a bit-line precharge transistor, and outputs it to the cell array core 103. The step-down circuit 112 decreases the source voltage VDD to generate a source voltage VSA (e.g. 1.0 V) for a sense amplifier SA, and outputs it to the cell array core 103. The reference power supply 113 reduces the source voltage VSA for the sense amplifier SA to generate a reference voltage HVDD (e.g. 0.5 V), and outputs it to the cell array core 103. The N-pump 114 reduces and inverts the source voltage VDD to generate a Low-side voltage VKK (e.g. −0.4 V) at the time of driving a word line and to generate a substrate potential VBB (e.g. −0.4 V) of a selection transistor, and outputs those to the cell array core 103. The P-pump 115 boosts up the source voltage VDD to generate a High-side voltage VPP (e.g. 2.5 V) at the time of driving the word line, and outputs it to the cell array core 103.

Conventionally, the source voltage VDD supplied to the entire circuits of the semiconductor device 101 is the same or higher voltage than the source voltage VSA that is supplied for the sense amplifier SA. Therefore, the source voltage VSA is generated directly from the source voltage VDD or generated by reducing the source voltage VDD. In a general-purpose DRAM, in particular, there is less number of bit-line divisions and the load capacity is large. Thus, an operating current Isa of the sense amplifier SA is large. Therefore, when comparing it with a word line current Iword, there is found a relation "Iword<Isa". Thus, it is essential to generate the operating current Isa from the VDD power supply that has a sufficient current supply capability. There is also the same tendency found when generating other voltages. Lately, there are also cases where the source voltage VPP is supplied from outside, because the electric current efficiency is poor when the source voltage VPP for driving the word lines is generated from the source voltage VDD.

As an example of the semiconductor device that operates by using a plurality of types of source voltages, Japanese Laid-Open Patent Publication JP-A-Heisei 11-213667 discloses a semiconductor memory device. This semiconductor memory device includes an input circuit, a peripheral circuit, a memory array portion, a first internal step-down circuit, and a second internal step-down circuit. The memory array portion includes memory cells arranged in matrix. The first internal step-down circuit reduces source voltages supplied from an output circuit and an external terminal to generate a first internal voltage. The second internal step-down circuit reduces the source voltage supplied from the external terminal, and generates a second internal voltage that has an absolutely larger voltage value than the first internal voltage. When the semiconductor memory device operates as a first power supply version where the source voltage supplied from the external terminal is set to have an absolutely larger voltage value than the second internal voltage, the first internal voltage generated by the first internal step-down circuit is supplied to the memory array portion, the second internal voltage generated by the second step-down circuit is supplied to the input circuit and the peripheral circuit, and the source voltage is supplied to the output circuit. In the meantime, when the semiconductor memory device operates as a second power supply version where the source voltage supplied from the external terminal is set to have an equal voltage value as that of the second internal voltage, the first internal voltage generated by the first internal step-down circuit is supplied to the memory array portion, the output of the second internal step-down circuit is isolated from the input circuit and the peripheral circuit, and the source voltage is supplied to the input circuit, the peripheral circuit, and the output circuit.

We have now discovered the following facts. Recently, thickness of gate oxide films of transistors in logic circuits has been made thinner in order to achieve a high-speed operation/a low electric current. In that case, the source voltage VDD of the logic circuit in the case of FIG. 1 is reduced to 1.0 V or less. In the meantime, it is necessary for the source voltage VSA for the sense amplifier SA to be set as about 1.0 V, because of an operation limit voltage of the sense amplifier. In general, a voltage fluctuation of ±10% is tolerated for the source voltage VDD. When the source voltage VSA is to be generated from the source voltage VDD that has an apparent decrease in its voltage value, it becomes necessary to boost up the voltage for generating the source voltage VSA when the source voltage VDD is reduced due to a fluctuation of the voltage. In such case where the source voltage VSA is generated from the source voltage VDD by boosting up, an efficiency of generating the voltage becomes deteriorated largely. In the meantime, if the source voltage VSA is generated without boosting up, an operation speed of the sense amplifier becomes deteriorated. It is therefore desired to achieve a technique which can supply the source voltage efficiently without deteriorating the operation speed of the sense amplifier and without being affected by the operation limit voltage.

SUMMARY

The present invention seeks to solve one or more of the above problems, or to improve upon those problems at least in part. In one embodiment, a semiconductor device includes: a first memory; and a voltage adjusting portion configured to receive a first voltage, a second voltage higher than the first voltage and a third voltage higher than the second voltage.

The first memory includes: a memory cell configured to be connected to a word line and a bit line, a word-line driving circuit configured to drive the word line, and a sense amplifier configured to sense information stored in the memory cell. The voltage adjusting portion includes: a voltage modifying circuit configured to step down or boost up the third voltage at a predetermined mode to generate a fourth voltage higher than the second voltage, and supply the fourth voltage to the sense amplifier or the word-line driving circuit.

In the present invention, the forth voltage is generated by one of stepping-down and boosting-up of the third voltage higher than the second voltage instead of the second voltage which is made to be reduced. Therefore, even though the second voltage is fluctuated to the lower voltage side, the sense amplifier is not affected by the fluctuation and can execute high speed operation.

In another embodiment, a semiconductor device includes: a logic circuit configured to receive a first voltage and a second voltage higher than the first voltage; and a memory portion configured to receive the first voltage, the second voltage and a third voltage higher than the second voltage. The memory portion includes: a first memory, a voltage adjusting portion, and a refresh control circuit. The first memory includes: a peripheral circuit configured to receive the first voltage and the second voltage, and a cell array core configured to receive the first voltage and the third voltage. The voltage adjusting portion receives the first voltage and the third voltage, and steps down or boosts up the third voltage at a predetermined mode to generate a fourth voltage and a fifth voltage which are higher than the second voltage. One of the third voltage, the fourth voltage and the fifth voltage is supplied to a sense amplifier in the cell array core, and one of the others is supplied to a word-line driving circuit in the cell array core. The refresh control circuit receives one of the third voltage, the fourth voltage and the fifth voltage, and executes a refresh operation for the cell array core when the second voltage is stopped.

In the present invention, the cell array core and the refresh control circuit execute a refresh operation by using the first and third voltages supplied from outside, and the forth and fifth voltages generated from the first and third voltage. That is, the second voltage is unnecessary for the refresh operation of the cell array core. Therefore, even if the second voltage is stopped, the refresh operation of the cell array core can be continuously executed. As a result, even when the second voltage is temporarily stopped such as a sleep mode or a standby mode where the operation of the logic circuit is temporarily stopped, the data stored in the memory is not erased. Thus, it is possible to reduce the power consumption because of the leak current in the logic circuit and the peripheral circuit in the semiconductor device by stopping the second voltage.

The present invention makes it possible to supply the source voltage efficiently without being affected by the operation limit voltage of the sense amplifier.

BRIEF DESCRIPTION OF THE DRAWINGS

The above and other objects, advantages and features of the present invention will be more apparent from the following description of certain preferred embodiments taken in conjunction with the accompanying drawings, in which:

FIG. 9 is a table showing a summary of the first to third embodiments of the present invention;

DESCRIPTION OF THE PREFERRED EMBODIMENTS

The invention will be now described herein with reference to illustrative embodiments. Those skilled in the art will recognize that many alternative embodiments can be accomplished using the teachings of the present invention and that the invention is not limited to the embodiments illustrated for explanatory purposed.

Embodiments of a semiconductor device according to the present invention will be described hereinafter with reference to the accompanying drawings.

First Embodiment

Figure 1:
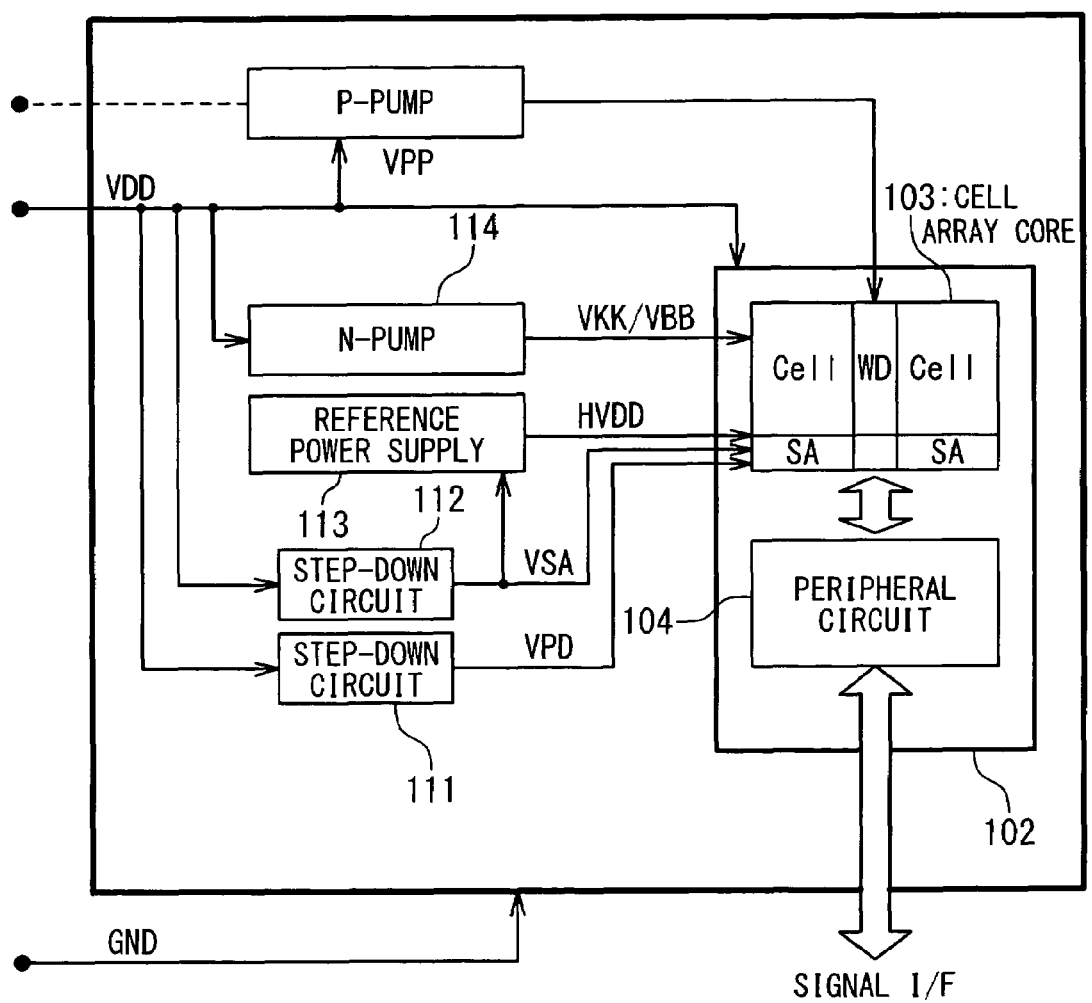
FIG. 1 is a block diagram showing an example of a structure of a typical semiconductor device.
Figure 2:
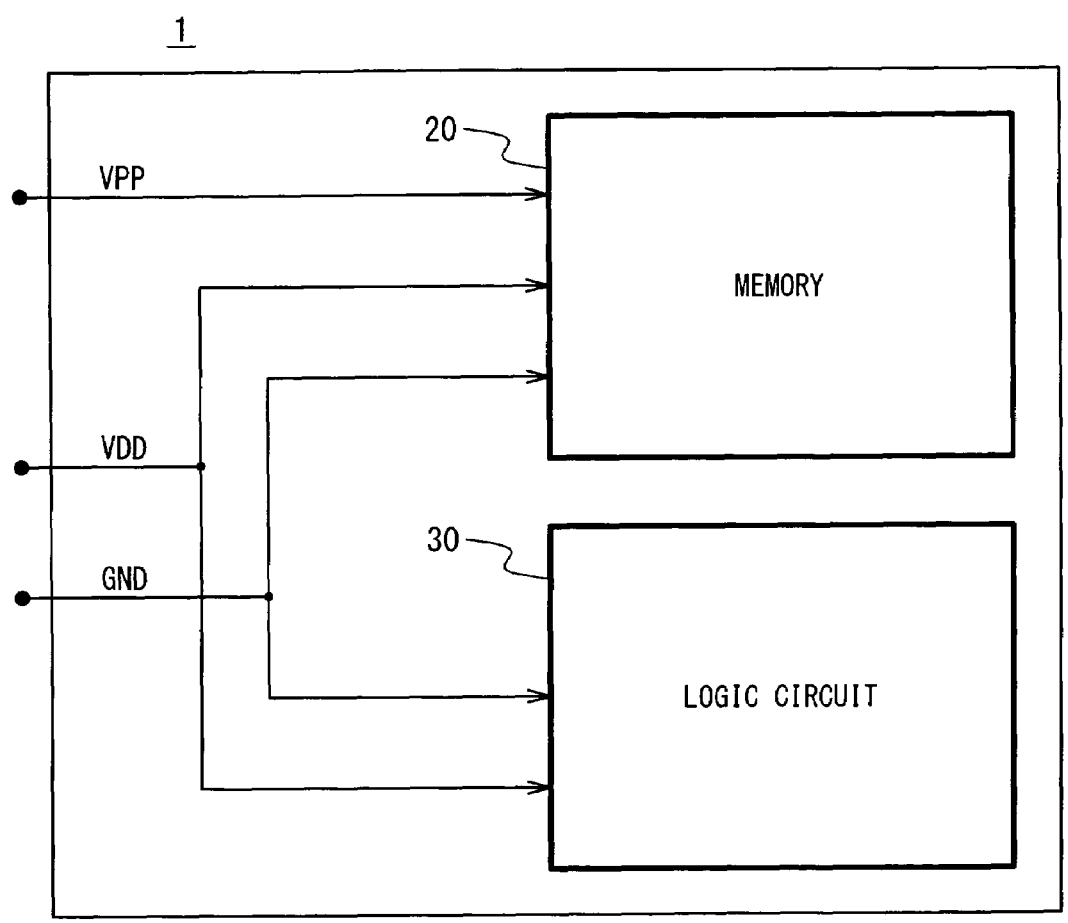
FIG. 2 is a block diagram showing a structure of a semiconductor device of the present invention.

FIG. 2 is a block diagram showing a structure of the semiconductor device according to a first embodiment of the present invention. This semiconductor device 1 includes a memory that uses a plurality of source voltages, such as an embedded-memory LSI (Large Scale Integration) The semiconductor device 1 includes a memory 20 and a logic circuit 30. The semiconductor device 1 receives a source voltage VPP, a source voltage VDD, and a ground voltage GND supplied from outside. The memory 20 operates by using the source voltage VPP, the source voltage VDD, and the ground voltage GND. The logic circuit 30 operates by using the source voltage VDD and the ground voltage GND.

Figure 3:
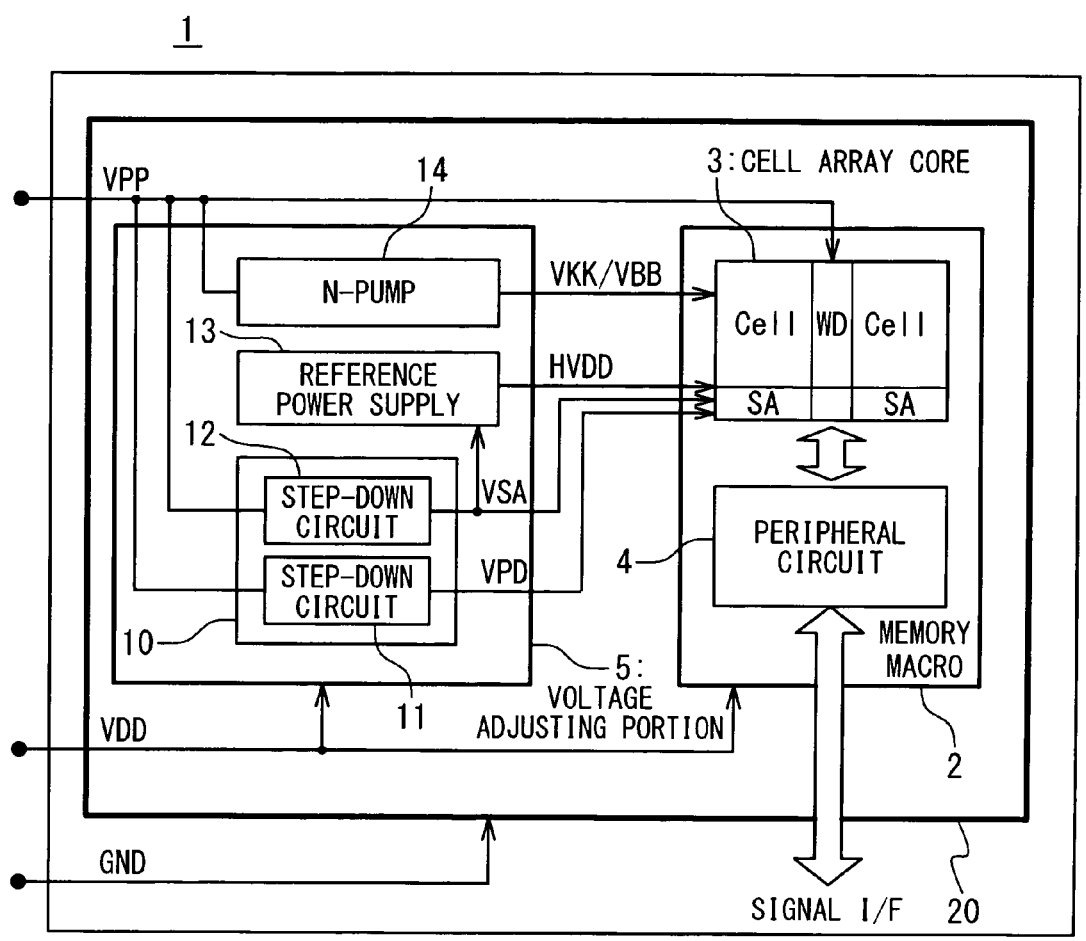
FIG. 3 is a block diagram showing the semiconductor device according to a first embodiment of the present invention.

FIG. 3 is a block diagram showing the semiconductor device according to a first embodiment of the present invention. This semiconductor device 1 receives a source voltage VPP (e.g. 2.5 V) for boosting up a voltage of a word line WL, a source voltage VDD (e.g. 0.9 V) for a logic circuit, and a ground voltage GND (e.g. 0 V) supplied from outside. This semiconductor device 1 includes a memory macro 2 and a voltage adjusting portion 5.

The voltage adjusting portion 5 generates a plurality of source voltages by using the source voltage VPP, the source voltage VDD, and the ground voltage GND supplied from outside. The voltage adjusting portion 5 supplies each of the plurality of source voltages to the memory macro 2. The voltage adjusting portion 5 includes a step-down circuit 11, a step-down circuit 12, a reference power supply 13, and a negative pump (N-pump) 14. Note here that the step-down circuit 11 together with the step-down circuit 12 can also be referred to as a voltage modifying circuit 10. The step-down circuit 11 can also be referred to as a first voltage adjusting circuit, and the step-down circuit 12 can be referred to as a second voltage adjusting circuit as well.

The step-down circuit 11 reduces the source voltage VPP to generate a High-side source voltage VPD (e.g. 1.2 V) of a bit-line precharge transistor, and outputs it to the cell array core 3. The step-down circuit 12 reduces the source voltage VPP to generate a source voltage VSA (e.g. 1.0 V) for a sense amplifier SA, and outputs it to the cell array core 3. The reference power supply 13 reduces the source voltage VSA for the sense amplifier SA to generate a reference voltage HVDD (e.g. 0.5 V), and outputs it to the cell array core 3. The N-pump 14 reduces and inverts the source voltage VPP to generate a Low-side voltage VKK (e.g. −0.4 V) at the time of driving the word line and a substrate potential VBB (e.g. −0.4 V) of a selection transistor, and outputs those to the cell array core 3.

The memory macro 2 is a memory circuit such as a DRAM core. The memory macro 2 includes the cell array core 3 and a peripheral circuit 4. The cell array core 3 stores data and the peripheral circuit 4 controls the cell array core 3. The cell array core 3 operates by using the source voltages VPP, VDD, source voltages VPD, VSA, HVDD, VKK, VBB generated by the voltage adjusting portion 5, and the ground voltage GND. The cell array core 3 includes a plurality of cells arranged in a matrix, a plurality of sense amplifiers, a word line driving circuit 21, a bit-line precharge driving circuit 22, a sense amplifier driving circuit 23 and a row decoder (not shown). The word line driving circuit 21, the bit-line precharge driving circuit 22 and the row decoder are included in a word line driving portion WD. The peripheral circuit 4 includes a decoder and a controller which are used for operations of the cell array core 3. The circuits, which include the peripheral circuit 4, in the memory macro 2 other than the cell array core 3 operate by using the source voltage VDD and the ground voltage GND.

Figure 4:
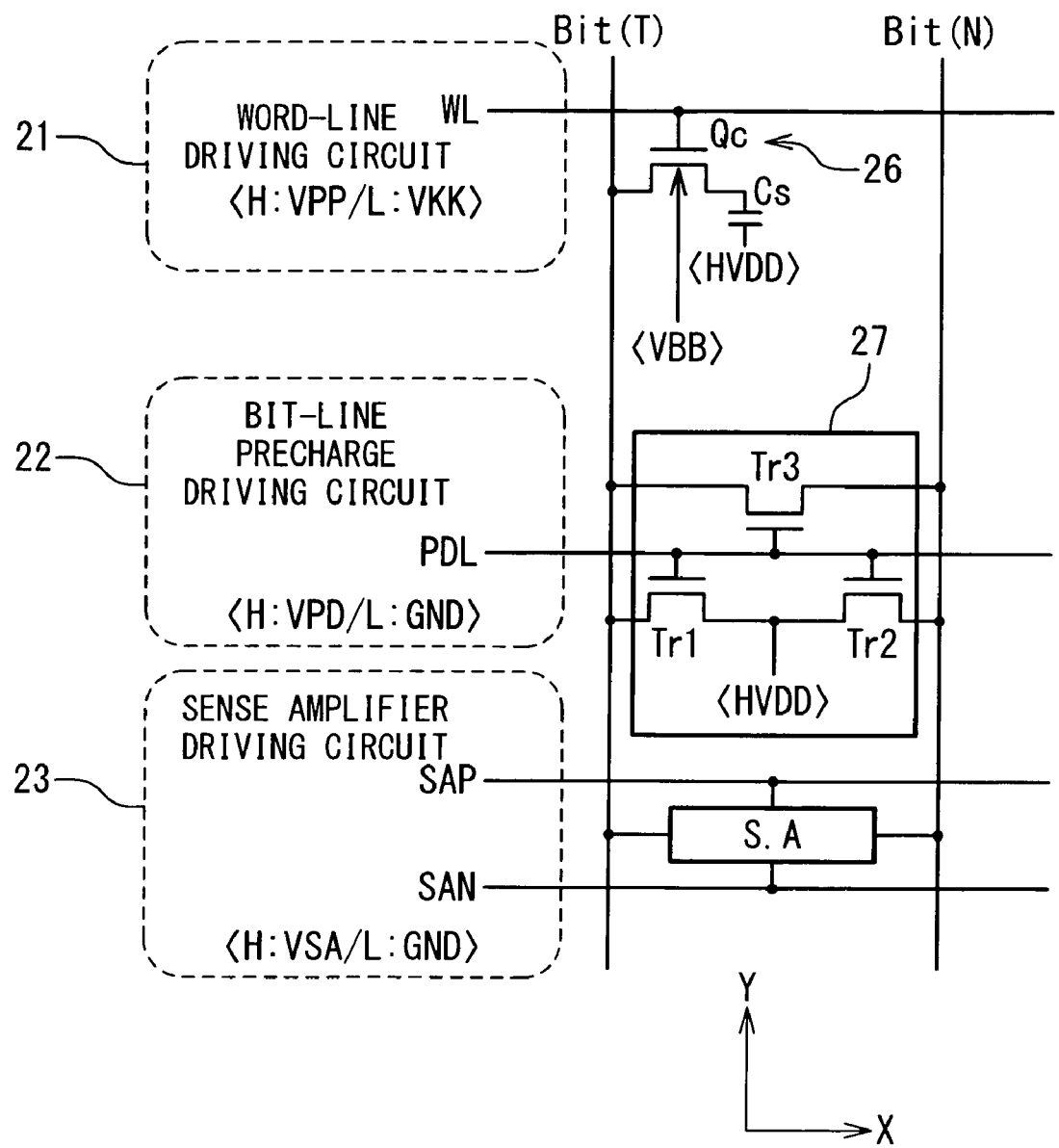
FIG. 4 is a schematic diagram showing a structure example of the cell array core of the semiconductor device according to the first embodiment of the present invention.

FIG. 4 is a schematic diagram showing a structure example of the cell array core 3 of the semiconductor device according to the first embodiment of the present invention. The cell array core 3 includes bit lines Bit(T), Bit(N), a word line WL, a precharge line PDL, sense amplifier control lines SAP, SAN, a memory cell 26, the word-line driving circuit 21, the bit-line precharge driving circuit 22, the sense amplifier driving circuit 23, a sense amplifier 24, and a precharge circuit 27.

The bit lines Bit(T) and Bit(N) are extended in a Y direction. The bit lines Bit(T) and Bit(N) are selected by a column decoder (not shown) in the peripheral circuit 4.

The word line WL is extended in an X direction that is perpendicular to the Y direction, and it is connected to the word line driving circuit 21. The word line WL is selected by the row decoder (not shown) in the word line driving portion WD.

The memory cell 26 is provided correspondingly in intersection points between the bit lines Bit(T), Bit(N) and the word line WL. The memory cell 26 includes a selection transistor Qc and a cell capacitance Cs. The cell capacitance Cs accumulates electric charges, and one end thereof is connected to a wiring that supplies the reference voltage HVDD while the other end is connected to the selection transistor Qc. An example of the selection transistor Qc is an NMOS transistor. In the selection transistor Qc, a gate is connected to the word line WL, one of source/drain is connected to the bit line Bit(T), and the other of source/drain is connected to the cell capacitance Cs. A substrate potential of the selection transistor Qc is VBB (e.g. −0.4 V).

The word line driving circuit 21 supplies a voltage (signal) for driving the selection transistor Qc of the memory cell 26. That is, at the time of reading operation or writing operation, the word line driving circuit 21 supplies, to the word line WL, the source voltage VPP (e.g. 2.5 V) for driving the gate of the selection transistor Qc to a High state and the source voltage VKK (e.g. −0.4 V) for driving it to a Low state. The source voltage VKK gives a negative gate potential to a non-selected cell to create a more secure non-selected (off) state in the non-selected cell so as to suppress a leakage of the non-selection transistor Qc.

The sense amplifier control lines SAP and SAN are extended in the X direction, and connected to the sense amplifier driving circuit 23 and the sense amplifier 24, respectively.

The sense amplifier driving circuit 23 supplies a voltage (signal) for driving the sense amplifier 24. That is, at the time of reading operation, the sense amplifier driving circuit 23 supplies, to the sense amplifier 24, the High-side source voltage VSA (e.g. 1.0 V) and the Low-side ground voltage GND (e.g. 0 V), respectively, via the sense amplifier control lines SAP and SAN.

The sense amplifier 24 is provided between every pair of the bit lines Bit(T) and Bit (N). The sense amplifier 24 is connected to the sense amplifier control lines SAP, SAN and the bit lines Bit(T), Bit(N). At the time of reading operation, the sense amplifier 24 detects a voltage difference between a pair of bit lines Bit(T) and Bit (N) and amplifies the difference. The data in the memory cell 26 is read according to the amplified potential difference.

Figure 10:
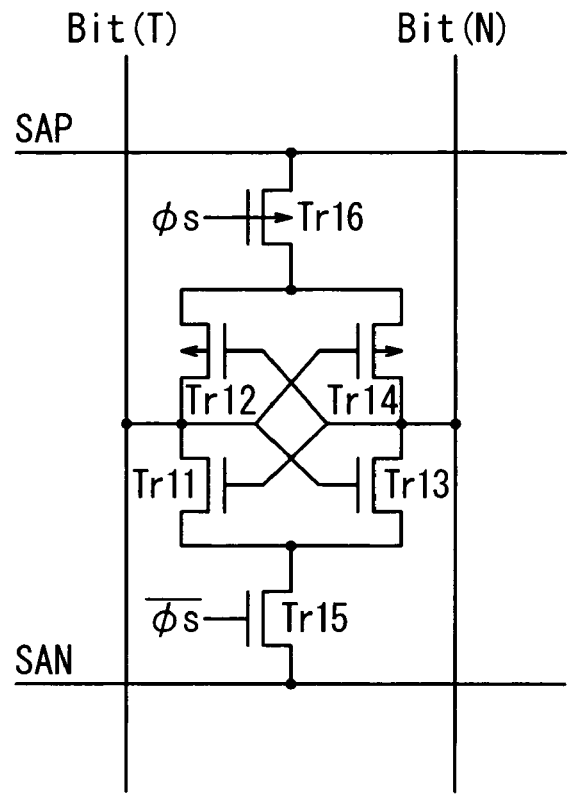
FIG. 10 is a circuit block diagram showing an example of a sense amplifier.

FIG. 10 is a circuit block diagram showing an example of the sense amplifier. The sense amplifier 24 includes transistors Tr11 to Tr16. The High-side source voltage VSA (e.g. 1.0 V) is supplied to a source of Tr16 (e.g. PMOS transistor) via the sense amplifier control line SAP. Further, the Low-side ground voltage GND (e.g. 0 V) is supplied to s source of Tr15 (e.g. NMOS transistor) via the sense amplifier control line SAN. Signals φs and /φs for controlling operations of the sense amplifier 24 are supplied to gates of the transistors Tr16 and Tr15 from the sense amplifier driving circuit 23 or another control circuit. The transistor Tr11 (e.g. NMOS transistor) and the transistor Tr12 (e.g. PMOS transistor) are connected in series, and gates thereof are connected to the Bit(N) and a connected point between the transistor Tr13 (e.g. NMOS transistor) and the transistor Tr14 (e.g. PMOS transistor), while a source of Tr11 is connected to a drain of the transistor Tr15 and a source of Tr12 is connected to a drain of the transistor Tr16. The transistors Tr13 and Tr14 are connected in series, and gates thereof are connected to the Bit(T) and a connected point between the transistors Tr11 and Tr12, while a source of Tr13 is connected to the drain of the transistor Tr15 and a source of Tr14 is connected to the drain of the transistor Tr16.

If the source voltage VDD, which is reduced to a low voltage due to a thin gate oxide film that is thinned for increasing the operation speed of the logic circuit, is used as it is for the source voltage VSA of the sense amplifier 24, the reading speed of the sense amplifier 24 becomes deteriorated. That is, the use of the reduced source voltage VDD deteriorates the operation speed. The present invention uses the source voltage VSA that is set by the voltage adjusting portion 5 to be equal to or higher than an operation limit voltage of the sense amplifier 24, in addition to the source voltage VDD. This makes it possible to obtain a sufficient source voltage VSA and to achieve a high-speed reading operation without imposing a load on the source voltage VDD.

Referring to FIG. 4, the precharge line PDL is extended in the X direction, and it is connected to the bit-line precharge driving circuit 22 and the precharge circuit 27, respectively.

The precharge circuit 27 is provided between every pair of bit lines Bit(T) and Bit(N). The precharge circuit 27 includes transistors Tr1 to Tr3 (e.g. NMOS transistors). Tr1 and Tr2 are connected in series. Gates thereof are connected to the precharge line PDL, one of source/drain of Tr1 is connected to the bit line Bit(T), and one of source/drain of Tr2 is connected to Bit(N). The others of source/drain of Tr1 and Tr2 are connected to each other at a connected point between the transistors Tr1 and Tr2. The connected point is connected to a wiring that shares the reference voltage HVDD (e.g. 0.5 V). In the transistor Tr3, a gate connected to the precharge line PDL, and the source/drain connected to the bit lines Bit(T) and Bit(N). The precharge circuit 27 precharges the pair of bit lines Bit(T) and Bit(N) to the reference voltage HVDD when the memory cell 26 is in a standby state. The reference voltage HVDD is set to be one half of the source voltage VSA. Each transistor of the precharge circuit 27 is micronized relatively, and the gate oxide film is formed thin. Thus, under a Highstate, it is possible to use the source voltage VPD that is relatively lower than the source voltage VPP for boosting up the word line.

The bit-line precharge driving circuit 22 supplies a voltage (signal) for driving the precharge circuit 27. That is, the bit-line precharge driving circuit 22 supplies, to the precharge line PDL, the source voltage VPD (e.g. 1.2 V) for driving the transistors Tr1 to Tr3 of the precharge circuit 27 to a High state, and a ground voltage GND (e.g. 0 V) for driving it to a Low state. Since the reference voltage HVDD is supplied to the source/drain of the transistors Tr1 and Tr2 of the precharge circuit 27, the source voltage VPD, which is higher than the reference voltage HVDD by an amount of a threshold voltage (e.g. 0.7 V) of the transistors Tr1 and Tr2, needs to be supplied to the gates thereof connected to the precharge line PDL.

Figure 5:
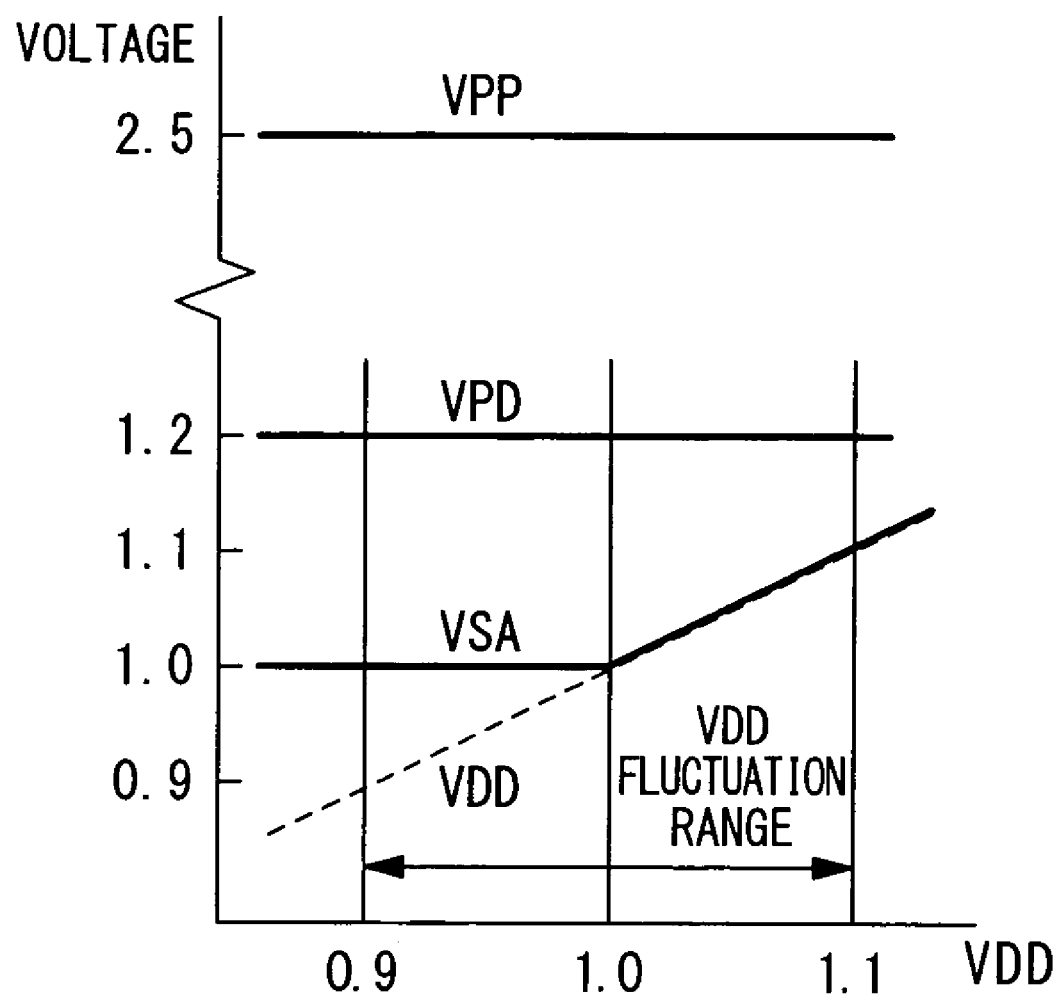
FIG. 5 is a graph showing relations between the source voltages VPP, VDD, VPD, and VSA of the semiconductor device according to the first embodiment of the present invention.

FIG. 5 is a graph showing relations between the source voltages VPP, VDD, VPD, and VSA of the semiconductor device according to the first embodiment of the present invention. A lateral axis shows the source voltage VDD, and a vertical axis shows the source voltages VPP, VDD, VPD, and VSA. The relative relations regarding the source voltages can be seen from the graph. However, a value therein of each source voltage is an example. As a recent tendency, the gate oxide film of the transistor in the peripheral circuit has been formed thinner so as to increase an operation speed of the peripheral circuit (logic circuit). Accordingly, the source voltage VDD for the peripheral circuit is reduced to be about 1.0 V. However, it is not preferable to use the source voltage that is equal to or less than a certain voltage, since there is an operation limit voltage set for the sense amplifier for enabling a high-speed operation. Here, it is a case where the source voltage VDD is 1.0 V and the source voltage VSA is 1.0 V.

In general, a voltage fluctuation of ±10% is tolerated for the operation voltage of the semiconductor device. Thus, assuming that the source voltage VDD is 1.0 V, a fluctuation range thereof is 0.9 V to 1.1 V. The source voltage VPP (2.5 V) to be supplied is constant within the fluctuation range. The source voltage VSA (1.0V) generated based on the source voltage VPP is basically constant, and it is constant until the source voltage VDD reaches 1.0 V (VSA>VDDmin). However, the source voltage VSA boosts up equally with the source voltage VDD when the source voltage VDD reaches 1.0 V or higher. It is for dielectric strength and measures for the electric current under high VDD. The source voltage VSA can be obtained by reducing the source voltage VDD within a fluctuation range thereof. The voltage VPD (1.2 V) generated based on the source voltage VPP is also constant within the fluctuation range.

The semiconductor device 1 of the present invention generates the low source voltage VSA for the sense amplifier 24 by reducing the high source voltage VPP supplied from the outside for boosting up a voltage of the word line WL.

As in the typical case, if it is tried to generate the source voltage VSA from the source voltage VDD, when the source voltage VDD is fluctuated to 0.9 V in the case of FIG. 5, for example, it becomes necessary to boost up the source voltage VDD by 0.1 V or more. That is inefficient. Meanwhile, when the voltage is not boosted up, the source voltage VSA becomes lower than the operation limit voltage. As a result, the operation speed of the sense amplifier 24 is deteriorated. On the other hand, in the present invention, the source voltage VSA is not generated from the source voltage VDD that is reduced to a low voltage for increasing the operation speed of the logic circuit (thinning the gate oxide film) but generated from the high source voltage VPP by reducing it. Therefore, it is possible to achieve a high-speed operation of the sense amplifier 24 even if the source voltage VDD fluctuates to a low voltage side.

As described above, the source voltage VPP for boosting up the voltage of the word line WL is a relatively high voltage, and there are products whose word line current Iword comes close to the operating current Isa of the sense amplifier 24. Particularly, depending on the type (e.g. eDRAM) of the memory macro 2, there is such a tendency that the word line direction (X direction in FIG. 4) becomes longer and the bit line direction (Y direction in FIG. 4) becomes shorter. Therefore, there are products of which Iword reaches Isa or even goes beyond. That is, since the proportion of Iword occupying the whole consumed electric current is increased, it is extremely effective for the memory cell to have the source voltage VPP supplied from outside.

Next, an operation of the semiconductor device 1 according to the present invention will be described.

The semiconductor device 1 receives a third voltage (source voltage VPP in this case) supplied from outside, in addition to the source voltage VDD and the ground voltage GND. The voltage adjusting portion 5 generates each of source voltages VPD, VKK/VBB, VSA, and HVDD based on the source voltage VDD, the ground voltage GND, and the source voltage VPP, and outputs those to the cell core array 3. The cell core array 3 operates based on each of the source voltages VPP, VPD, VKK/VBB, VSA, HVDD, and the ground voltage GND. Further, the peripheral circuit 4 operates based on the source voltage VDD and the ground voltage GND.

With the present invention, it is possible to generate the source voltage VSA without being affected by a fluctuation of the source voltage VDD through having the source voltage VPP for boosting up the voltage of the word line WL supplied from outside and reducing the source voltage VPP to generate the source voltage VSA for the sense amplifier. Thereby, the source voltage VSA can be supplied efficiently, which makes it possible to execute a stable and high-speed operation.

Second Embodiment

FIG. 2 is a block diagram showing a structure of the semiconductor device according to a second embodiment of the present invention. The explanation is omitted because the structure is the same as that in the first embodiment except for a replacement of the memory 20 with a memory 20b.

Figure 6:
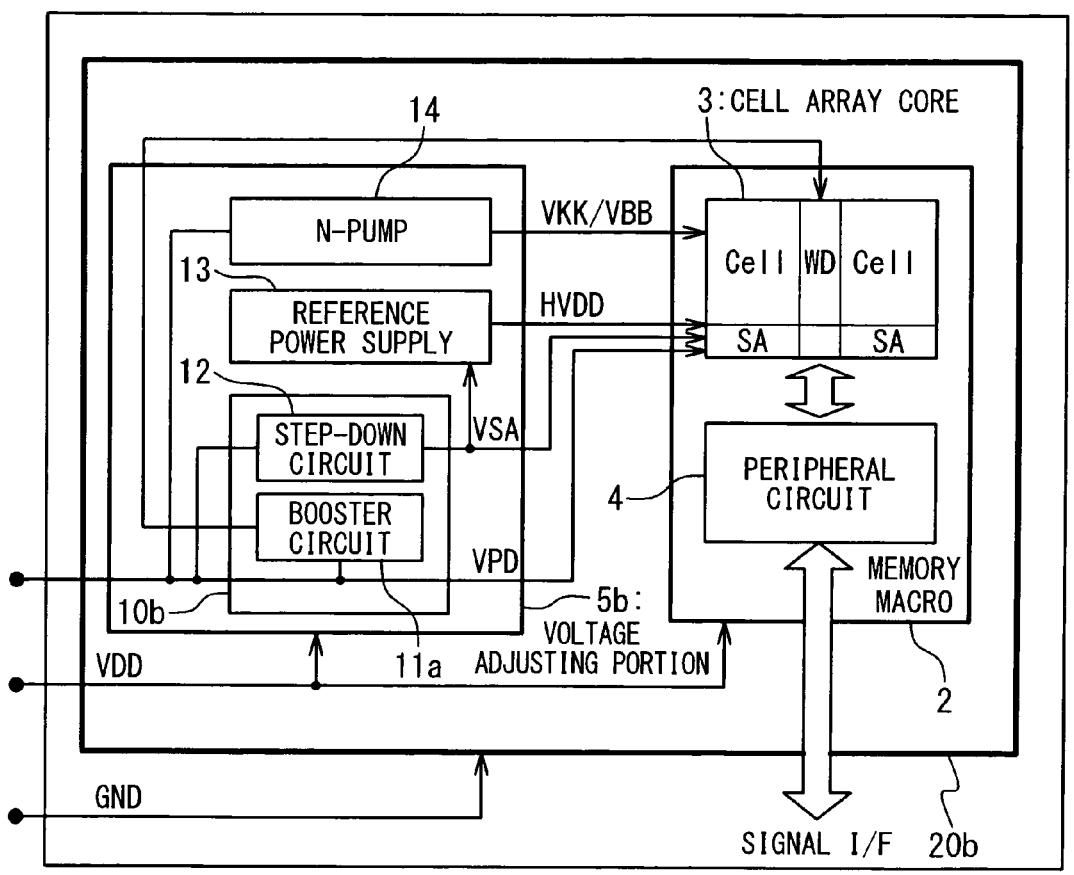
FIG. 6 is a block diagram showing another structure of the semiconductor device according to a second embodiment of the present invention.

FIG. 6 is a block diagram showing another structure of the semiconductor device according to a second embodiment of the present invention. This drawing shows details of the memory 20b in particular. The present embodiment is different from the first embodiment in respect that not the source voltage VPP but the source voltage VPD is supplied from outside. That is, this semiconductor device 1b receives a High-side source voltage VPD for a bit-line precharging transistor (e.g. 1.2 V), a source voltage VDD (e.g. 0.9 V) for a logic circuit, and a ground voltage GND (e.g. 0 V) supplied from outside. This semiconductor device 1b (the memory 20b) includes a memory macro 2 and a voltage adjusting portion 5b.

The voltage adjusting portion 5 generates a plurality of source voltages by using the source voltage VPD, the source voltage VDD, and the ground voltage GND supplied from outside, and supplies each of the plurality of source voltages to the memory macro 2. The voltage adjusting portion 5 includes a booster circuit 11a, a step-down circuit 12, a reference power supply 13, and a negative pump (N-pump) 14. Note here that the booster circuit 11a together with the step-down circuit 12 can also be referred to as a voltage modifying circuit 10b. The booster circuit 11a can also be referred to as a fist voltage adjusting circuit, and the step-down circuit 12 can be referred to as a second voltage adjusting circuit as well.

The booster circuit 11a boosts up the source voltage VPD to generate the source voltage VPP (e.g. 2.5 V) for boosting up the voltage of the word line WL, and outputs it to the cell array core 3. The step-down circuit 12 reduces the source voltage VPD to generate a source voltage VSA (e.g. 1.0 V) for a sense amplifier SA, and outputs it to the cell array core 3. The reference power supply 13 reduces the source voltage VSA for the sense amplifier SA to generate a reference voltage HVDD (e.g. 0.5 V), and outputs it to the cell array core 3. The N-pump 14 reduces and inverts the source voltage VPD to generate a Low-side voltage VKK (e.g. −0.4 V) at the time of driving the word line and a substrate potential VBB (e.g. −0.4 V) of a selection transistor, and outputs those to the cell array core 3.

Except for the fact that the other source voltages are generated not from the source voltage VPP but from the source voltage VPD, the second embodiment is the same as the first embodiment shown in FIG. 3. Thus, explanations thereof will be omitted.

Next, an operation of the semiconductor device 1b according to the present invention will be described.

The semiconductor device 1b receives a third voltage (source voltage VPD in this case) supplied from outside, in addition to the source voltage VDD and the ground voltage GND. The voltage adjusting portion 5b generates each of source voltages VPP, VKK/VBB, VSA, and HVDD based on the source voltage VDD, the ground voltage GND, and the source voltage VPD, and outputs those to the cell core array 3. The cell core array 3 operates based on each of the source voltages VPP, VPD, VKK/VBB, VSA, HVDD, and the ground voltage GND. Further, the peripheral circuit 4 operates based on the source voltage VDD and the ground voltage GND.

With the present invention, it is possible to generate the source voltage VSA without being affected by a fluctuation of the source voltage VDD through supplying the source voltage VPD for precharging the bit lines from outside and reducing it to generate the source voltage VSA for the sense amplifier. Thereby, the source voltage VSA can be supplied efficiently, which makes it possible to execute a stable and high-speed operation.

Third Embodiment

FIG. 2 is a block diagram showing a structure of the semiconductor device according to a third embodiment of the present invention. The explanation is omitted because the structure is the same as that in the first embodiment except for a replacement of the memory 20 with a memory 20c.

Figure 7:
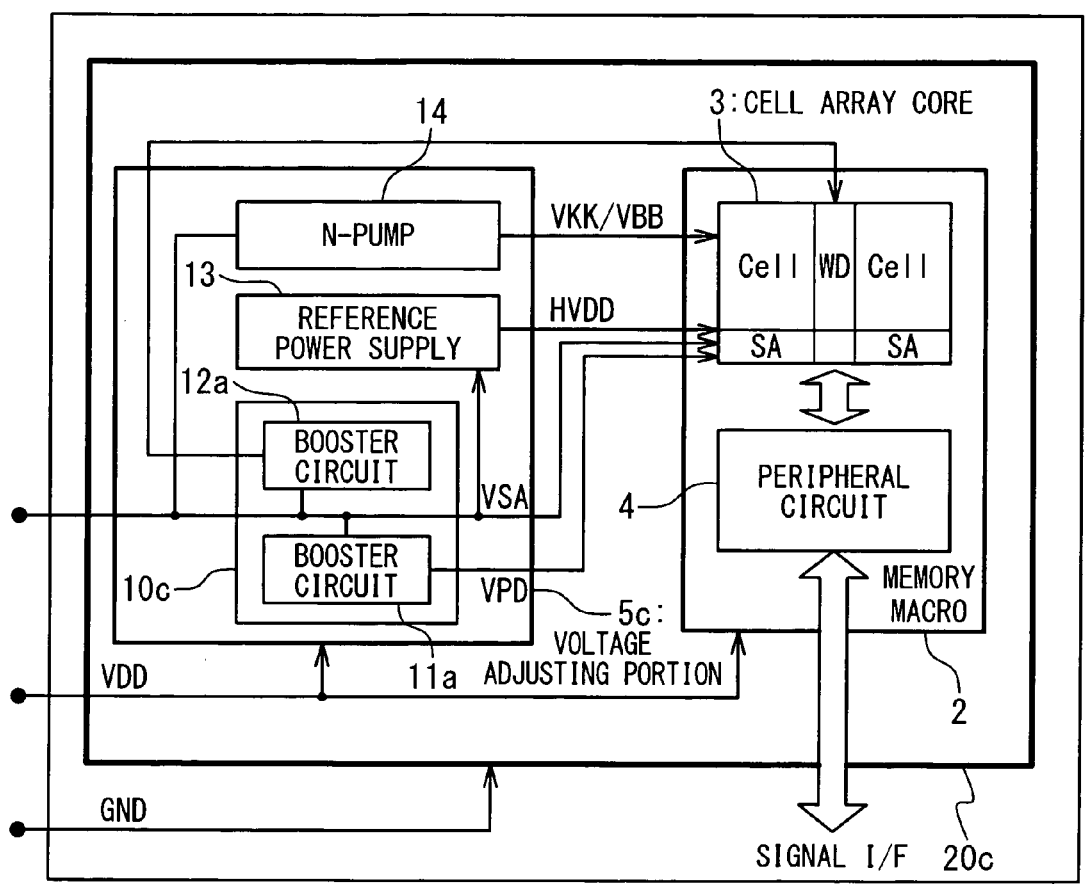
FIG. 7 is a block diagram showing still another structure of the semiconductor device according to a third embodiment of the present invention.

FIG. 7 is a block diagram showing still another structure of the semiconductor device according to a third embodiment of the present invention. This drawing shows details of the memory 20c in particular. This embodiment is different from the first embodiment in respect that not the source voltage VPP but the source voltage VSA is supplied from outside. That is, this semiconductor device 1c receives a source voltage VSA (e.g. 1.0 V) for a sense amplifier, a source voltage VDD (e.g. 0.9 V) for a logic circuit, and a ground voltage GND (e.g. 0 V) supplied from outside. This semiconductor device 1c (the memory 20c) includes a memory macro 2 and a voltage adjusting portion 5c.

The voltage adjusting portion 5 generates a plurality of source voltages by using the source voltage VSA, the source voltage VDD, and the ground voltage GND supplied from outside, and supplies each of the plurality of source voltages to the memory macro 2. The voltage adjusting portion 5 includes a booster circuit 11a, a booster circuit 12a, a reference power supply 13, and a negative pump (N-pump) 14. Note here that the booster circuit 11a together with the booster circuit 12a can also be referred to as a voltage modifying circuit 10c. The booster circuit 11a can also be referred to as a first voltage adjusting circuit, and the booster circuit 12a can be referred to as a second voltage adjusting circuit as well.

The booster circuit 11a boosts up the source voltage VSA to generate a High-side source voltage VPD (e.g. 1.2 V) for a bit-line precharge transistor, and outputs it to the cell array core 3. The booster circuit 12a boosts up the source voltage VSA to generate the source voltage VPP (e.g. 2.5 V) for boosting up the voltage of the word line WL, and outputs it to the cell array core 3. The reference power supply 13 reduces the source voltage VSA to generate a reference voltage HVDD (e.g. 0.5 V), and outputs it to the cell array core 3. The N-pump 14 reduces and inverts the source voltage VSA to generate a Low-side voltage VKK (e.g. −0.4 V) at the time of driving the word line and a substrate potential VBB (e.g. −0.4 V) of a selection transistor, and outputs those to the cell array core 3.

Except for the fact that the other source voltages are generated not from the source voltage VPP but from the source voltage VSA, the third embodiment is the same as the first embodiment shown in FIG. 3. Thus, explanations thereof will be omitted.

Next, an operation of the semiconductor device 1c according to the present invention will be described.

The semiconductor device 1c receives a third voltage (source voltage VSA in this case) supplied from outside, in addition to the source voltage VDD and the ground voltage GND. The voltage adjusting portion 5c generates each of source voltages VPP, VDD, VKK/VBB, and HVDD based on the source voltage VDD, the ground voltage GND, and the source voltage VSA, and outputs those to the cell core array 3. The cell core array 3 operates based on each of the source voltages VPP, VPD, VKK/VBB, VSA, HVDD, and the ground voltage GND. Further, the peripheral circuit 4 operates based on the source voltage VDD and the ground voltage GND.

With the present invention, it is possible to utilize the source voltage VSA without being affected by a fluctuation of the source voltage VDD through supplying and using the source voltage VSA for the sense amplifier from outside. Thereby, the source voltage VSA can be supplied efficiently, which makes it possible to execute a stable and high-speed operation.

Fourth Embodiment

FIG. 2 is a block diagram showing a structure of the semiconductor device according to a fourth embodiment of the present invention. The explanation is omitted because the structure is the same as that in the first embodiment except for a replacement of the memory 20 with a memory 20a.

Figure 8:
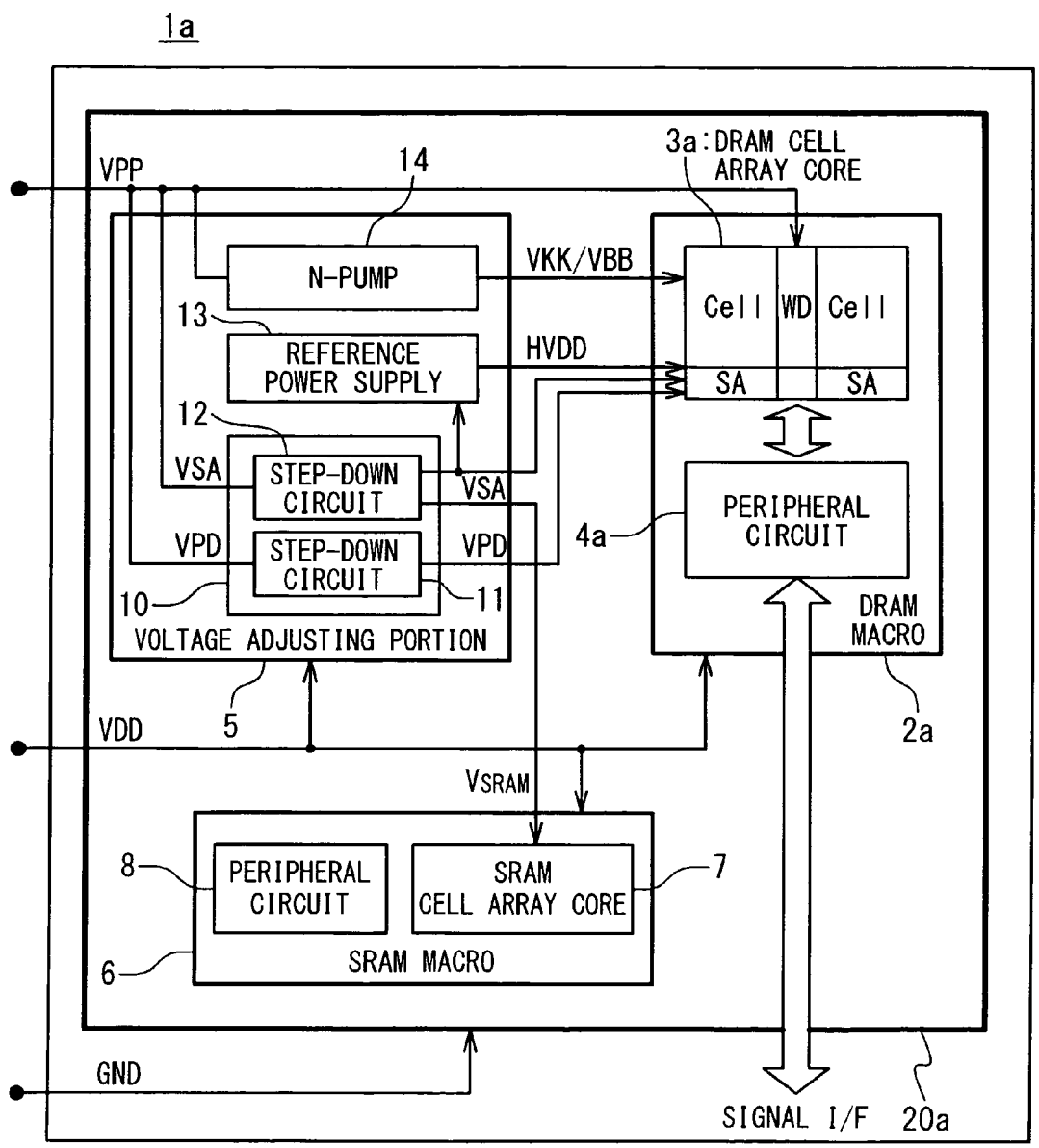
FIG. 8 is a block diagram showing a structure of the semiconductor device according to a fourth embodiment of the present invention.

FIG. 8 is a block diagram showing a structure of the semiconductor device according to a fourth embodiment of the present invention. This drawing shows details of the memory 20d in particular. This semiconductor device 1a receives a source voltage VPP (e.g. 2.5 V) for boosting up the voltage of the word line WL, a source voltage VDD (e.g. 0.9 V) for a logic circuit, and a ground voltage GND (e.g. 0 V) supplied from outside. This semiconductor device 1a includes a DRAM macro 2a, an SRAM macro 6, and a voltage adjusting portion 5.

The DRAM macro 2a (including a DRAM cell array core 3a) and the voltage adjusting portion 5 are the same as the memory macro 2 (including the cell array core 3) and the voltage adjusting portion 5 of the first embodiment, so that explanations thereof is omitted.

The SRAM macro 6 is a memory circuit that has a plurality of SRAM cells. The SRAM macro 6 includes an SRAM core array 7 for storing data, and a peripheral circuit 8 for controlling the SRAM cell array core 7. The peripheral circuit 8 operates by using the source voltage VDD and the ground voltage GND. The peripheral circuit 8 includes a decoder, a controller, and the like used for operations of the SRAM cell array core 7. The SRAM cell array core 7 operates by using the source voltage VDD, a source voltage $V_{SRAM}$ that is the same as the source voltage VSA generated by the voltage adjusting portion 5, and the ground voltage GND. The SRAM cell core array 7 includes a plurality of SRAM cells arranged in matrix, a plurality of bit lines, a plurality of word lines, and the like.

The fourth embodiment is a case where the source voltage VPP is supplied from outside, so that VSA and $V_{SRAM}$ are supplied to the SRAM cell array core 7 via the voltage adjusting portion 5. However, when the source voltage VSA is supplied from outside as in the case of the third embodiment, the inputted source voltage VSA may be directly inputted to the SRAM cell array core 7 as $V_{SRAM}$ without going through the voltage adjusting portion 5.

Figure 11:
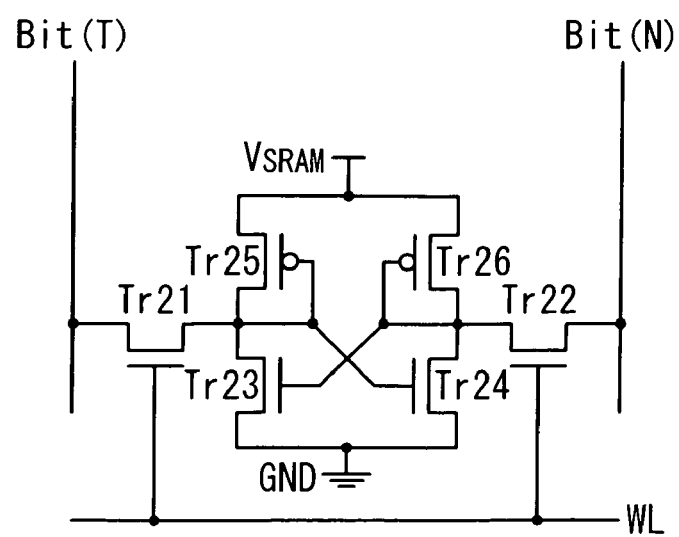
FIG. 11 is a circuit block diagram showing an example of an SRAM cell.

FIG. 11 is a circuit block diagram showing an example of the SRAM cell. The SRAM cell includes transistors Tr21 to Tr24 (e.g. NMOS transistors) and transistors Tr25 and Tr26 (e.g. PMOS transistors). The source voltage $V_{SRAM}$ is supplied to sources of the transistors Tr25 and Tr26. A drain of the transistor Tr25 is connected to one of source/drain of the transistor Tr21, and to a gate of the transistor Tr24 as well as to a drain of the transistor Tr23. A gate of the transistor Tr25 is connected to the gate of the transistor Tr24. A drain of the transistor Tr26 is connected to one of source/drain of the transistor Tr22, and to a gate of the transistor Tr23 as well as to a drain of the transistor Tr24. A gate of the transistor Tr26 is connected to the gate of the transistor Tr23. The ground potential GND is supplied to sources of the transistors Tr23 and 24. A gate of the transistor Tr21 is connected to the word line WL, and the remainder of the source/drain thereof is connected to the bit line Bit(T). A gate of the transistor Tr22 is connected to the word line WL, and the remainder of the source/drain thereof is connected to the bit line Bit(N).

This SRAM cell has almost the same circuit structure (Flip-Flop circuit) as that of the sense amplifier 24 of the DRAM shown in FIG. 10. Therefore, like the operation limit occur in the sense amplifier 24 of the DRAM cell array core 3a because of the reduction in the source voltage, the SRAM cell is also affected by the reduction in the source voltage VDD caused by the gate oxide film that is formed thinner for corresponding to the high-speed operation of the logic circuit. That is, the use of the source voltage VDD that is reduced to a low voltage causes a problem of deteriorating the operation speed. For the SRAM cell, the source voltage VSA set by the voltage adjusting portion 5 to be equal to or higher than the operation limit voltage of the sense amplifier 24 is also supplied as the source voltage $V_{SRAM}$ for driving the SRAM cell, in addition to the source voltage VDD. That is, in the case of FIG. 5, it is set to have "VSA=$V_{SRAM}$=1.0 V" for "VDD=0.9 V". This makes it possible to eliminate the influences upon the operation speed of the SRAM cell caused by the reduction in the source voltage VDD.

Since any source voltages VSA that are supplied to the sense amplifier 24 of the DRAM cell array core 3a can be supplied as the source voltage $V_{SRAM}$ for driving the SRAM cell, both the second and the third embodiments described above can be also applied to the fourth embodiment.

The present invention makes it possible not only to achieve the effects of the first to third embodiments but also to enable the SRAM cell to perform a stable and high-speed operation even with the source voltage VDD that is reduced to a low voltage because of the miniaturization of the logic circuit.

FIG. 9 is a table showing a summary of the first to third embodiments of the present invention. It shows how VPP, VPD, and VSA are generated internally in the cases where the externally inputted power supplies are VPP, VPD, and VSA, respectively. For example, when it is defined that the externally inputted source voltage is VPP (first embodiment), VPP is supplied from outside. VPD and VSA are generated internally by reducing the externally inputted VPP, respectively. When it is defined that the externally inputted source voltage is VPD (second embodiment), VPD is supplied from outside. VPP is generated internally by boosting up the externally inputted VPP, and VSA is generated by reducing the externally inputted VPD. When it is defined that the externally inputted source voltage is VSA (third embodiment), VSA is supplied from outside. VPP and VPD are generated internally by boosting up the externally inputted VSA, respectively. All of the first to third embodiments apply to the fourth embodiment as well.

Fifth Embodiment

Figure 12:
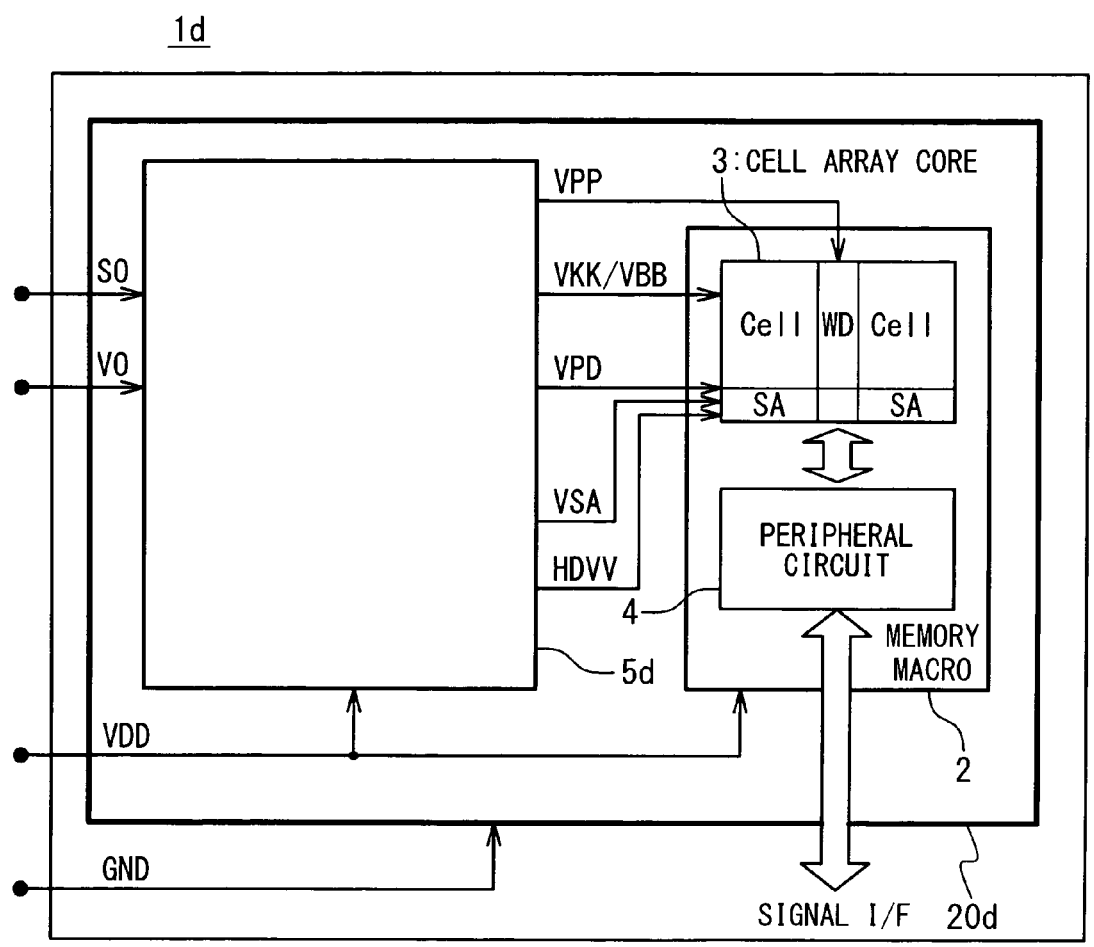
FIG. 12 is a block diagram showing a structure of the semiconductor device according to a fifth embodiment of the present invention.

FIG. 2 is a block diagram showing a structure of the semiconductor device according to a fifth embodiment of the present invention. A structure shown in this drawing is the same as that of the first embodiment, except that the memory 20 is replaced with a memory 20d. Therefore, explanations thereof will be omitted. FIG. 12 is a block diagram showing a structure of the semiconductor device according to the fifth embodiment of the present invention. This drawing shows details of the memory 20d in particular. The present embodiment is different from the first to third embodiments in respect that one of the source voltages supplied from outside is not a specific predetermined source voltage (e.g. VPP) but a voltage determined after the manufacture of the semiconductor device. That is, this semiconductor device 1d receives a source voltage V0 for the cell array core 3, a source voltage VDD (e.g. 0.9 V) for the logic circuit, and a ground voltage GND (e.g. 0 V) supplied from outside. Note here that the source voltage V0 is one of the source voltages selected from a source voltage VPP (e.g. 2.5 V) for boosting up the word line WL, a High-side source voltage VPD (e.g. 1.2V) for the bit-line precharge transistor, and a source voltage VSA (e.g. 1.0 V) for the sense amplifier SA. A value of the source voltage V0 is set by a predetermined method after the manufacture of the semiconductor device. It is decided whether to boost up or to reduce the source voltage V0 based on the setting. The semiconductor device 1d (the memory 20d thereof) includes a memory macro 2 and a voltage adjusting portion 5d.

Figure 13:
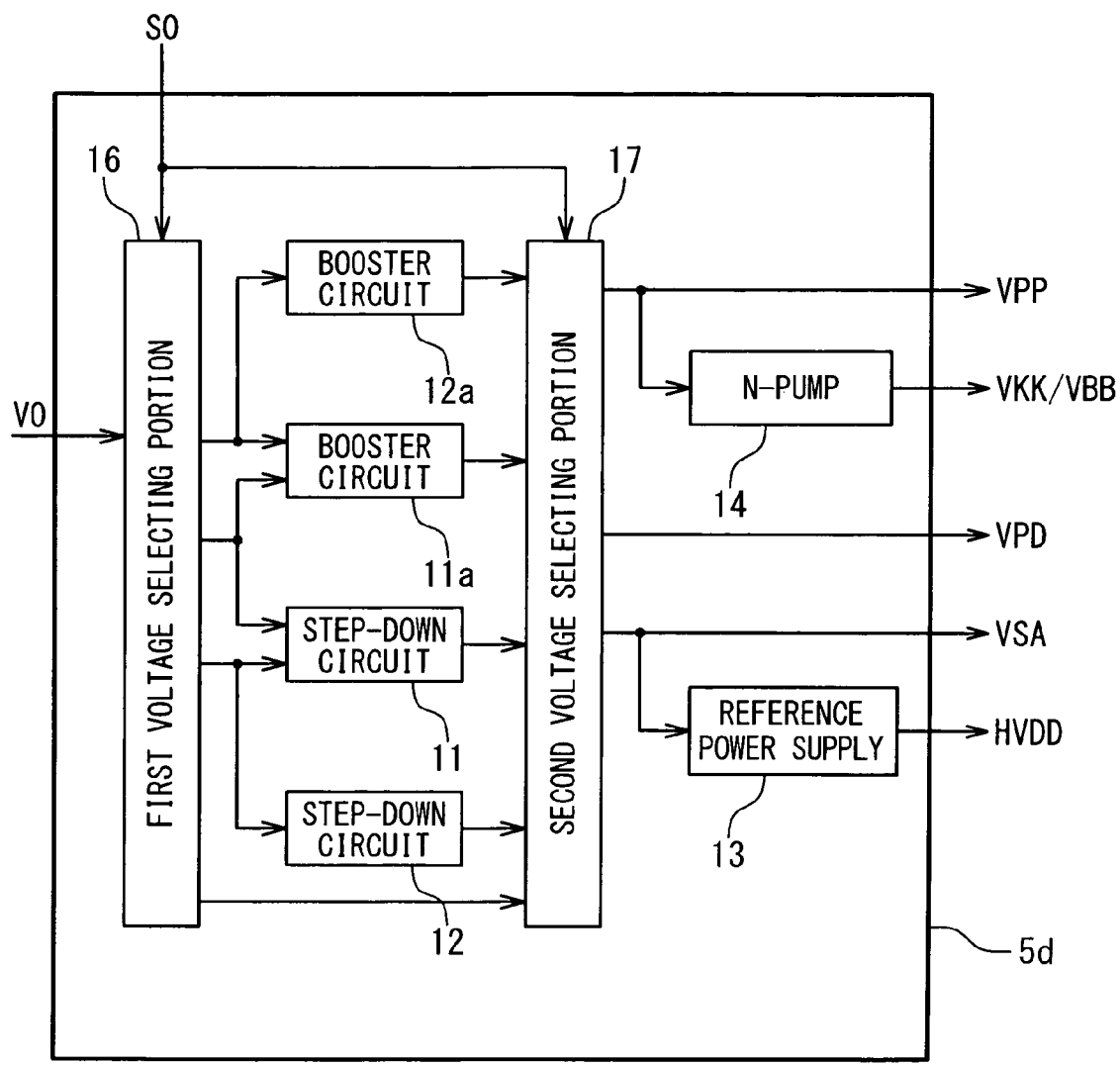
FIG. 13 is a block diagram showing a structure of the voltage adjusting portion of the semiconductor device according to a fifth embodiment of the present invention.

FIG. 13 is a block diagram showing a structure of the voltage adjusting portion of the semiconductor device according to the fifth embodiment of the present invention. The voltage adjusting portion 5d includes a first voltage selecting portion 16, a booster circuit 12a, a booster circuit 11a, a step-down circuit 11, a step-down circuit 12, a second voltage selecting portion 17, an N-pump 14, and a reference power supply 13.

The first voltage selecting portion 16 selects two circuits from the booster circuit 12a, the booster circuit 11a, the step-down circuit 12, and the step-down circuit 11. Then, the first voltage selecting portion 16 supplies the supplied source voltage V0 to the two selected circuits.

Specifically, the first voltage selecting portion 16 first judges whether the source voltage V0 is the source voltage VPP (e.g. 2.5 V), the source voltage VPD (e.g. 1.2 V), or the source voltage VSA (e.g. 1.0 V). For making the judgment, there is considered a method in which two reference voltages Vref1 and Vref2 are set in advance (VSA<Vref1<VPD<Vref2<VPP), and those are compared with the source voltage V0, for example. Alternatively, there is considered a method in which a signal indicating the type of the source voltage is included in a control signal S0 that is inputted to the memory 20d from outside, for example.

Then, the first voltage selecting portion 16 outputs the source voltage V0 in a following manner based on the judgment. When the source voltage V0 is the source voltage VPP, the source voltage V0 is outputted to the step-down circuit 11 and the step-down circuit 12 as in the case of the first embodiment. When the source voltage V0 is the source voltage VPD, the source voltage V0 is outputted to the booster circuit 11a and the step-down circuit 12 as in the case of the second embodiment. When the source voltage V0 is the source voltage VSA, the source voltage V0 is outputted to the booster circuit 11a and the booster circuit 12a as in the case of the third embodiment. Further, the first voltage selecting portion 16 directly outputs the source voltage V0 to the second voltage selecting portion 17.

The booster circuit 12a and the booster circuit 11a boost up the supplied source voltage V0, and output them to the second voltage selecting portion 17. Further, the step-down circuit 12 and the step-down circuit 11 reduce the supplied source voltage V0, and output those to the second voltage selecting portion 17. These are the same operations described in the first to third embodiments.

The second voltage selecting portion 17 outputs the two voltages outputted from the two selected circuits as well as the source voltage V0 directly outputted from the first voltage selecting portion 16 to the cell array core 3 as the source voltages VPP, VPD, and VSA in order from the larger one. For determining the order from the larger one, there is the above-described method that compares the source voltages with the reference voltages, or the method that makes judgment based on a signal included in the control signal S0 for indicating the type of the source voltage.

The first voltage selecting portion 16 and the second voltage selecting portion 17 may be so set that an output destinations of the voltages therefrom cannot be changed by the control signal S0 after the manufacture of the semiconductor device 1d, or may be so set that the output destination can be changed by an input of the control signal S0 later on. For setting those to be unchangeable, there is considered a method in which the setting is programmed to a fuse or a non-rewritable memory device, for example. For setting those to be changeable, there is considered a method in which the setting is programmed to a rewritable memory device.

The N-pump 14 reduces and inverts the source voltage VPP to generate a Low-side source voltage VKK (e.g. −0.4 V) at the time of driving a word line and a substrate potential VBB (e.g. −0.4 V) of a selection transistor, and outputs those to the cell array core 3. However, the source voltages VPD and VSA may be taken as the inputs. The reference power supply 13 reduces the source voltage VSA to generate a reference voltage HVDD (e.g. 0.5 V), and outputs it to the cell array core 3.

Other configurations are the same as the case of the first embodiment shown in FIG. 3, except that other source voltages are generated not from the source voltage VPP but from the source voltage V0. Therefore, explanations thereof will be omitted.

Next, an operation of the semiconductor device 1d according to the present invention will be described.

The semiconductor device 1d receives the third voltage (source voltage V0 in this case) supplied from outside, in addition to the source voltage VDD and the ground voltage GND. The voltage adjusting portion 5d refers to the type, the magnitude and the like of the source voltage V0, and generates each of the source voltages VPP, VPD, VKK/VBB, VSA, and HVDD based on the source voltage VDD, the ground voltage GND, and the source voltage V0. Specifically, the first voltage selecting portion 16 selects whether to boost up or to reduce the source voltage V0 by referring to the type, the magnitude and the like of the source voltage V0. Then, based on that selection, the first voltage selecting portion 16 outputs the source voltage V0 to two circuits selected from the booster circuits 12a, 11a, and the step-down circuits 12, 11. When the source voltage V0 is supplied to the booster circuits 12a and 11a, those circuits boost up the source voltage V0. When the source voltage V0 is supplied to the step-down circuits 12 and 11, those circuits reduce the source voltage V0. The second voltage selecting portion 17 receives the boosted/reduced source voltages V0 from the two selected circuits, and receives the source voltage V0 directly from the first voltage selecting portion 16. Then, the second voltage selecting portion 17 refers to the magnitude and the like of those voltages, and output, to the cell array core 3, a maximum voltage as the source voltage VPP, a middle voltage as the source voltage VPD, and a minimum voltage as the source voltage VSA. The source voltage VPP (may also be VPD or VSA) via the N-pump 14 is outputted to the cell array core 3 as VKK/VBB. The source voltage VSA via the reference power supply 13 is outputted to the cell array core 3 as HVDD. The cell array core 3 operates based on each of the source voltages VPP, VPD, VKK/VBB, VSA, HVDD, and the ground voltage GND. Further, the peripheral circuit 4 operates based on the source voltage VDD and the ground voltage GND.

The same effect as those of the first to third embodiments can be achieved with the fifth embodiment. In addition, it is possible with the fifth embodiment to determine the type of the source voltage V0 to be supplied, after the manufacture of the semiconductor device. This makes it possible to improve the flexibility in terms of the usage of the semiconductor device.

Sixth Embodiment

FIG. 2 is a block diagram showing a structure of the semiconductor device according to a sixth embodiment of the present invention. The structure in this drawing is the same as that of the first embodiment, except that the memory 20 is replaced with a memory 20e. Therefore, explanations thereof will be omitted.

Figure 14:
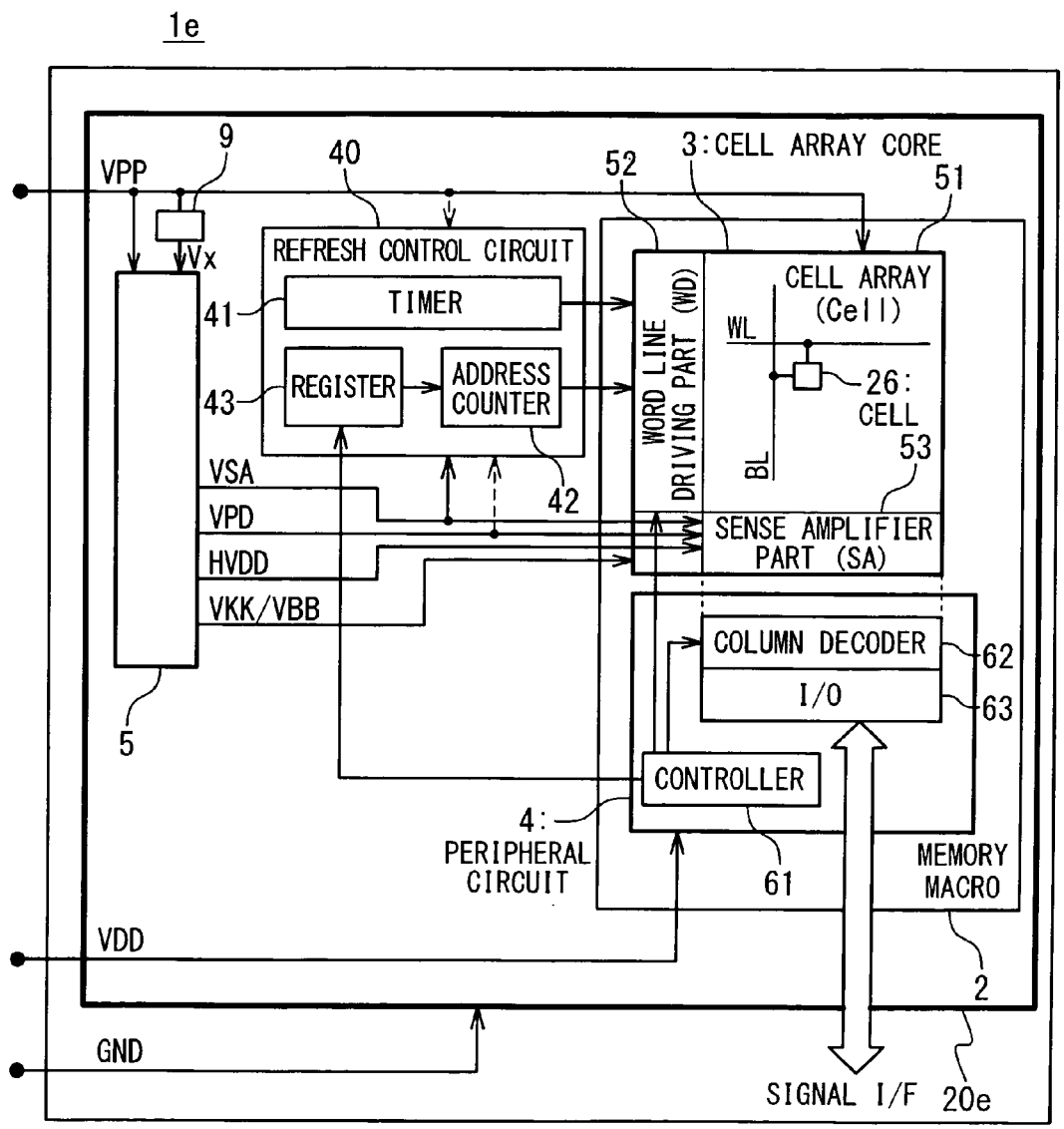
FIG. 14 is a block diagram showing a structure of the semiconductor device according to the sixth embodiment of the present invention.

FIG. 14 is a block diagram showing the structure of the semiconductor device according to the sixth embodiment of the present invention. This drawing shows details of the memory 20e in particular. This semiconductor device 1e receives a source voltage VPP (e.g. 2.5 V) for boosting up the word line WL, a source voltage VDD (e.g. 0.9 V) for the logic circuit, and a ground voltage GND (e.g. 0 V) supplied from outside. The semiconductor device 1e (the memory 20e thereof) includes a memory macro 2, a voltage adjusting portion 5, a step-down circuit 9, and a refresh control circuit 40.

Recently, there has been more and more reduction in the source voltage VDD used in the logic circuit and the memory so as to meet the demands for achieving low power consumption. It is because such reduction in the source voltage reduces electric currents (active electric currents) that flow in activated (driven) transistors, which results in reducing the power consumption. However, reduction of the source voltage VDD may possibly cause deterioration in the performance of the transistors (deterioration in the operation speed). In order to prevent the deterioration in the performance, it is effective to reduce a threshold voltage of the transistors. However, reduction of the threshold voltage causes an increase in a leak current, which may increase the power consumption as a result. In order to suppress the increase in the leak current, it is considered to stop the supply of the source voltage VDD temporarily when the logic circuit is not in operation. However, if the supply of the source voltage VDD is simply stopped temporarily in a case where a DRAM is used as the memory, refresh operations cannot be executed. As a result, stored data becomes erased.

This embodiment is capable of executing a refresh operation (Self-Refresh operation) in the cell array core 3 continuously, and temporarily stopping the source voltage VDD simultaneously. This makes it possible to reduce the power consumption because of the leak current in the transistors of the logic circuit 30 and the peripheral circuit 4 by temporarily stopping the source voltage VDD, while preventing erasure of data stored in the memory 20e by executing the refresh operation.

Hereinafter, the semiconductor device 1e (the memory 20e) will be described in details.

The step-down circuit 9 reduces the source voltage VPP for boosting up the word line WL to generate a source voltage Vx for the voltage adjusting portion 5. The voltage adjusting portion 5 operates with the source voltage Vx instead of the source voltage VDD. Here, the source voltage Vx may be supplied only when the supply of the source voltage VDD is stopped (will be described later). In that case, the source voltage VDD is supplied to the voltage adjusting portion 5 when the voltage adjusting portion 5 is in a normal operation.

This voltage adjusting portion 5 is the same as that of the first embodiment, except that it operates with the source voltage Vx. That is, the voltage adjusting portion 5 generates a plurality of source voltages by using the source voltage VPP, the source voltage Vx, and the ground voltage GND supplied from outside, and supplies each of the plurality of source voltages to the memory macro 2. Details thereof will be omitted.

The memory macro 2 is a memory circuit such as a DRAM core. The memory macro 2 includes a cell array core 3 for storing data, and a peripheral circuit 4 for controlling the cell array core 3.

The cell array core 3 operates by using the source voltage VPP, the source voltages VPD, VSA, HVDD, VKK, and VBB which are generated by the voltage adjusting portion 5, as well as the ground voltage GND. The cell array core 3 includes a cell array (Cell) 51, a word line driving portion (WD) 52, and a sense amplifier portion (SA) 53. The cell array 51 includes a plurality of word lines WL, a plurality of bit lines BL, and a plurality of cells 26 that are arranged in matrix and placed correspondingly to the intersection points between the plurality of word lines WL and the plurality of bit lines BL (Bit). The word line driving portion 52 includes a word line driving circuit 21, a bit-line precharge circuit 22, and a row decoder (not shown). The sense amplifier portion 53 includes a plurality of sense amplifiers and a sense amplifier driving circuit 23.

The peripheral circuit 4 includes a controller 61 used for operations of the cell array core 3, a column decoder 62, and an I/O portion 63. The circuits including the peripheral circuit 4 in the memory macro 2 other than the cell array core 3 operate by using the source voltage VDD and the ground voltage GND.

The fifth embodiment is the same as the case of the first embodiment in terms of the structure of the cell array core 3 shown in FIG. 4, the relations regarding the source voltages VPP, VDD, VPD, and VSA shown in FIG. 5, and the example of the structure of the sense amplifier shown in FIG. 10. Therefore, explanations thereof will be omitted.

The refresh control circuit 40 executes refresh operations of the cell array core 3 when the supply of the source voltage VDD is stopped. The refresh control circuit 40 operates by using the source voltage VSA that is generated by the voltage adjusting portion 5. However, it may operate by using the source voltage VPD generated by the voltage adjusting portion 5 or may operate by using the source voltage VPP as illustrated with broken lines in the drawing. In such case, the characteristic of the device composed of the refresh control circuit 40 is set to correspond to the source voltage to be used, for example. The refresh control circuit 40 includes a timer 41, an address counter 42, and a register 43.

The timer 41 outputs a signal for requesting a refresh operation to the word line driving portion 52 at a predetermined period. The address counter 42 outputs, to the word line driving portion 52, a row address at which the refresh operation is to be executed. The word line driving portion 52 executes the refresh operation for the row corresponding to the row address sent from the address counter 42, in response to the signal from the timer 41 outputted at the predetermined period. After completing the refresh operation for one row, the address counter 42 outputs a next row address to the word line driving portion 52 in preparation for a next refresh operation.

The register 43 stores information indicating a range of the cell array 51 for executing the refresh operation. That is, the register 43 stores information indicating the range of row addresses (e.g. xx row-yy row) for executing the refresh operation. The address counter 42 outputs the row addresses of the range (e.g. xx row-yy row) indicated in the information stored in the register 43 at the time of the refresh operation. As a result, for example, when the range of the row addresses for executing the refresh operation includes 100%, 50%, or 25% of the entire rows, the refresh operation is executed on the cell array 51 in the range of 100%, 50%, or 25%. If the refresh operation is to be executed on a 100% range at all times, it is not necessary to provide the register 43.

In the present embodiment, the voltage adjusting portion 5 operates by using the source voltage VPP and the ground voltage GND supplied from outside. Thus, the voltage adjusting portion 5 can generate the other source voltages VPD, VKK/VBB, VSA, and HVDD required for the refresh operations without using the source voltage VDD. Therefore, the source voltage VDD becomes unnecessary for supplying each of the source voltages VPP, VPD, VKK/VBB, VSA, and HVDD which are required for the refresh operations of the cell array core 3. In addition, the refresh control circuit 40 also operates by using the source voltage VPP supplied from outside or by using the source voltage generated by the voltage adjusting portion 5 and the ground voltage GND. Therefore, the source voltage VDD becomes unnecessary for the refresh operations of the refresh control circuit 40. Because of that, it is possible with the present embodiment to execute the refresh operations of the cell array core 3 continuously even if the supply of the source voltage VDD is stopped. As a result, when there is such a condition that requires no source voltage VDD such as a sleep mode or a standby mode where the operation of the logic circuit 30 is temporarily stopped, the supply of the source voltage VDD can be stopped without loosing the data stored within the memory 20. Thus, it is possible to reduce the power consumption because of the leak current in the logic circuit 30 and the peripheral circuit 4 in the semiconductor device 1e by stopping the supply of the source voltage VDD.

Further, by using the register 43, the target of the refresh operation can be set as not on the entire cell array 51 but on a part of the cell array 51. The power consumption in the refresh operation can be suppressed by limiting the refresh operation to be executed on a part of the cell array 51. That is, the power consumption of the semiconductor device 1e can be reduced further.

Next, an operation of the semiconductor device 1e according to the present invention will be described.

When the logic circuit 30 is not used, i.e., under a sleep mode or a standby mode, the semiconductor device 1e stops the supply of the source voltage VDD. The logic circuit 30 and the peripheral circuit 4 which operate with the source voltage VDD stop the operations. Therefore, no leak current flows in the transistors thereof, so that the power consumption can be reduced. In the meantime, the voltage adjusting portion 5 receives the source voltage VPP, the ground voltage GND, and the source voltage Vx that is supplied from a step-down circuit 9. The voltage adjusting portion 5 generates each of the source voltages VPD, VKK/VBB, VSA, and HVDD based on the source voltage VPP, the ground voltage GND, and the source voltage Vx. Each of the source voltages, VPP, VPD, VKK/VBB, VSA, HVDD, and the ground voltage GND is outputted to the cell array core 3. The cell array core 3 can operate with those source voltages. One of the source voltages VPP, VPD, and VSA is supplied to the refresh control circuit 40. The refresh control circuit 40 can operate with the source voltage. The cell array core 3 executes a refresh operation on the memory cells 26 provided along the word line WL that is indicated by the row address sent from the address counter 42 at the timing of the signal from the timer 41.

The same effect as that of the first embodiment can be achieved with the first embodiment.

In addition, it is possible to reduce the power consumption because of the leak current in the transistors of the logic circuit and the peripheral circuit by temporarily stopping the supply of the source voltage VDD, while preventing data stored in the memory from being lost by executing the refresh operation.

Figure 15:
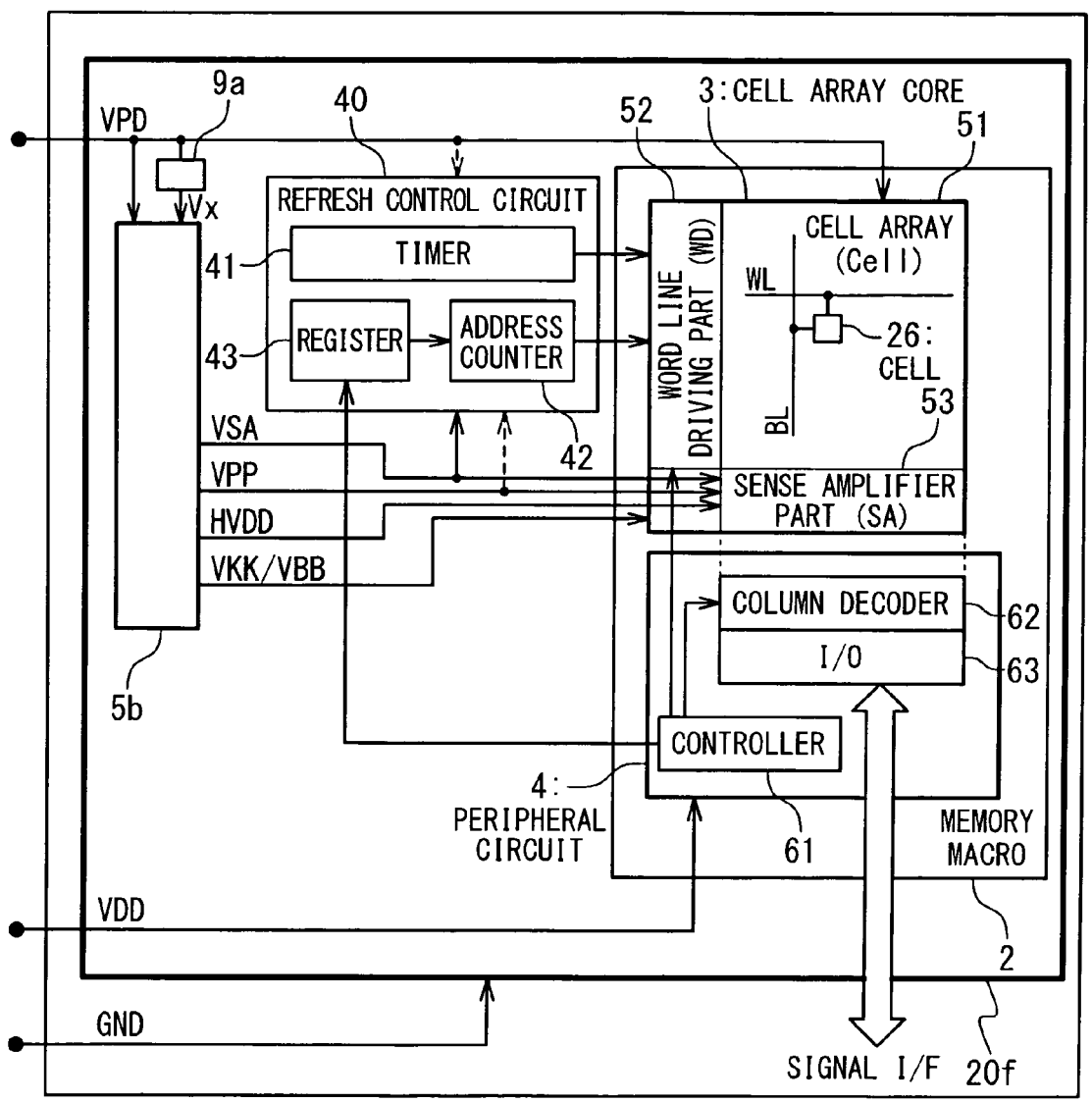
FIG. 15 is a block diagram showing another structure of the semiconductor device according to the sixth embodiment of the present invention.

As in the case of the first embodiment, the semiconductor device 1e shown in FIG. 14 receives VPP supplied from outside as the source voltage. However, VPD may be supplied from outside as the source voltage, as in the case of the second embodiment. It is illustrated in FIG. 15. FIG. 15 is a block diagram showing another structure of the semiconductor device according to the sixth embodiment of the present invention. The general view thereof is shown in FIG. 2, while the memory 20 is replaced with a memory 20f. This semiconductor device 1f (including the memory 20f) is the same as the semiconductor device 1e of FIG. 14, except that the source voltage supplied from outside is VPD, a voltage adjusting portion is the same as the voltage adjusting portion 5b of the second embodiment, and a step-down circuit 9a generates the source voltage Vx from the source voltage VPD. Therefore, explanations thereof will be omitted. It is also possible with this case to achieve the same effect as that of the case shown in FIG. 14.

Figure 16:
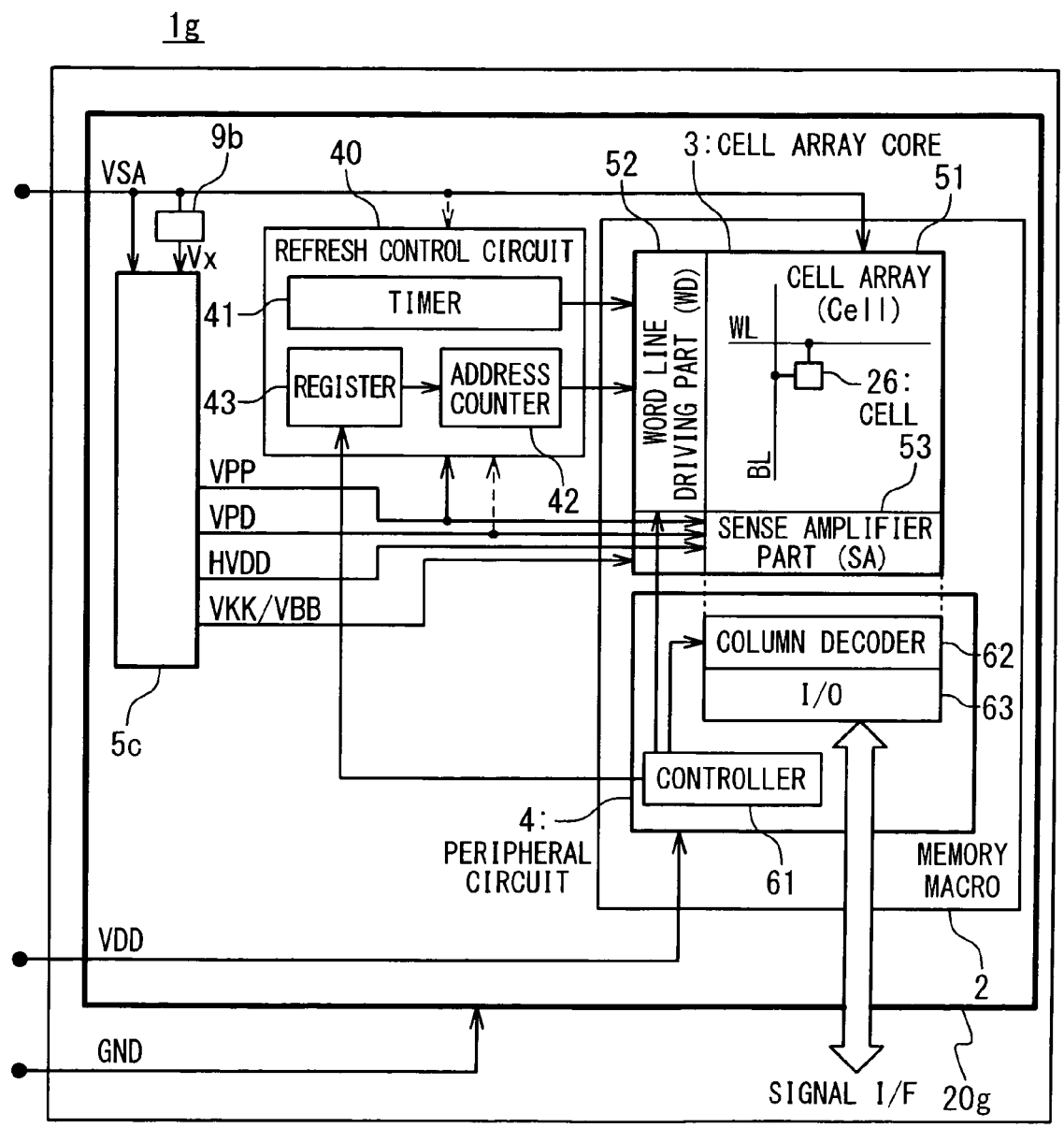
FIG. 16 is a block diagram showing still another structure of the semiconductor device according to the sixth embodiment of the present invention.

As in the case of the first embodiment, the semiconductor device 1e shown in FIG. 14 receives VPP supplied from outside as the source voltage. However, VSA may be supplied from outside as the source voltage, as in the case of the third embodiment. It is illustrated in FIG. 16. FIG. 16 is a block diagram showing still another structure of the semiconductor device according to the sixth embodiment of the present invention. The general view thereof is shown in FIG. 2, while the memory 20 is replaced with a memory 20g. This semiconductor device 1g (including the memory 20g) is the same as the semiconductor device 1e of FIG. 14, except that the source voltage supplied from outside is VSA, the voltage adjusting portion is the same as the voltage adjusting portion 5c of the third embodiment, and a step-down circuit 9b generates the source voltage Vx from the source voltage VSA. Therefore, explanations thereof will be omitted. It is also possible with this case to achieve the same effect as that of the case shown in FIG. 14.

It is apparent that the present invention is not limited to the above embodiment, but may be modified and changed without departing from the scope and spirit of the invention.

What is claimed is:

1. A semiconductor device comprising:
   a first memory; and
   a voltage adjusting portion configured to receive a first voltage, a second voltage higher than said first voltage, and a third voltage higher than said second voltage,
   wherein said first memory includes:
   a memory cell configured to be connected to a word line and a bit line,
   a word-line driving circuit configured to drive said word line, and
   a sense amplifier configured to sense information stored in said memory cell,
   wherein said voltage adjusting portion includes:
   a voltage modifying circuit configured to step down or boost up said third voltage at a predetermined mode to generate a fourth voltage higher than said second voltage, and supply said fourth voltage to said sense amplifier or said word-line driving circuit.

2. The semiconductor device according to claim 1, wherein said first memory includes a DRAM (Dynamic Random Access Memory).

3. The semiconductor device according to claim 1, wherein said voltage modifying circuit includes:
   a first voltage adjusting circuit configured to step down said third voltage to generate a fifth voltage between said third voltage and said fourth voltage, and supply said fifth voltage to a precharge circuit which precharges said bit line, and
   a second voltage adjusting circuit configured to step down said third voltage to generate said fourth voltage, and supply said fourth voltage to said sense amplifier.

4. The semiconductor device according to claim 3, wherein said voltage adjusting portion further includes:
   a selection portion configured to select one of boosting-up and stepping-down of said third voltage to generate said fourth voltage, and select one of boosting-up and stepping-down of said third voltage to generate fifth voltage.

5. The semiconductor device according to claim 1, wherein said voltage modifying circuit includes:
   a second voltage adjusting circuit configured to step down said third voltage to generate a fifth voltage between said third voltage and said second voltage, and supply said fifth voltage to said sense amplifier, and
   a first voltage adjusting circuit configured to boost up said third voltage to generate said fourth voltage, and supply said fourth voltage to said word-line driving circuit.

6. The semiconductor device according to claim 5, wherein said voltage adjusting portion further includes:
   a selection portion configured to select one of boosting-up and stepping-down of said third voltage to generate said fourth voltage, and select one of boosting-up and stepping-down of said third voltage to generate fifth voltage.

7. The semiconductor device according to claim 1, wherein said voltage modifying circuit includes:
   a first voltage adjusting circuit configured to boost up said third voltage to generate a fifth voltage between said third voltage and said fourth voltage, and supply said fifth voltage to a precharge circuit which precharges said bit line, and
   a second voltage adjusting circuit configured to boost up said third voltage to generate said fourth voltage, and supply said fourth voltage to said word-line driving circuit.

8. The semiconductor device according to claim 7, wherein said voltage adjusting portion further includes:
   a selection portion configured to select one of boosting-up and stepping-down of said third voltage to generate said fourth voltage, and select one of boosting-up and stepping-down of said third voltage to generate fifth voltage.

9. The semiconductor device according to claim 1, further comprising:
   a second memory configured to includes a SRAM (Static Random Access Memory),
   wherein said voltage modifying circuit supplies said fourth voltage to a sense amplifier in said SRAM.

10. The semiconductor device according to claim 1, further comprising:
    a logic circuit,
    wherein said logic circuit operates by using said first voltage and said second voltage.

11. A semiconductor device comprising:
    a word line connecting to a memory cell in a memory chip;
    a word-line driving circuit driving said word line;
    a bit line connecting to said memory cell;
    a sense amplifier sensing information stored in said memory cell; and
    a voltage adjusting portion,
    wherein said voltage adjusting portion receives a first voltage, a second voltage higher than said first voltage, and a third voltage higher than said second voltage, and
    wherein said voltage adjusting portion steps down or boosts up said third voltage at a predetermined mode to generate a fourth voltage and a fifth voltage, supplies one of said fourth voltage and said fifth voltage to one of said sense amplifier and said word-line driving circuit, and supplies the other of said fourth voltage and said fifth voltage to the other of said sense amplifier and said word-line driving circuit.

12. The semiconductor device according to claim 11, wherein said voltage adjusting portion further includes:
    a selection portion configured to select one of boosting-up and stepping-down of said third voltage to generate said fourth voltage, and select one of boosting-up and stepping-down of said third voltage to generate fifth voltage.

13. The semiconductor device according to claim 11, further comprising:
    a logic circuit,
    wherein said logic circuit operates by using said first voltage and said second voltage.

14. A semiconductor device comprising:
    a logic circuit configured to receive a first voltage and a second voltage higher than said first voltage; and
    a memory portion configured to receive said first voltage, said second voltage, and a third voltage higher than said second voltage,
    wherein said memory portion includes:
    a first memory,
    a voltage adjusting portion, and
    a refresh control circuit,
    wherein said first memory includes:
    a peripheral circuit configured to receive said first voltage and said second voltage, and
    a cell array core configured to receive said first voltage and said third voltage,
    wherein said voltage adjusting portion receives said first voltage and said third voltage, and steps down or boosts up said third voltage at a predetermined mode to generate a fourth voltage and a fifth voltage which are higher than said second voltage,
    wherein one of said third voltage, said fourth voltage and said fifth voltage is supplied to a sense amplifier in said cell array core, and one of the others is supplied to a word-line driving circuit in said cell array core,
wherein said refresh control circuit receives one of said third voltage, said fourth voltage and said fifth voltage, and executes a refresh operation for said cell array core when said second voltage is stopped.

15. The semiconductor device according to claim 14, wherein said refresh control circuit executes said refresh operation for only a part of said cell array core.

* * * * *